(12) United States Patent
Kim et al.

(10) Patent No.: US 7,348,841 B2
(45) Date of Patent: Mar. 25, 2008

(54) MULTIPLE POWER MODE AMPLIFIER WITH BIAS MODULATION OPTION AND WITHOUT BYPASS SWITCHES

(76) Inventors: Junghyun Kim, Woo-wul Villa 403 ho, 178-76, Bongchon 11 dong, Kwanak-gu, Seoul (KR); Daehee Lee, Sinnae APT 605-605, Sinnae-Dong 650, Jungrang-gu, Seoul (KR); Sanghwa Jung, Joogong APT 15 dong-401 ho, 532 Gojan-dong, Ansan, Kyunggi-Do (KR); Youngwoo Kwon, 103 Hyunjin Villa, Bundang-dong, Bundang-gu, Seongnam, Kyunggi-Do (KR); Moon-Seok Jeon, 101 ho, 98-1, Bongchon dong, Kwanak-gu, Seoul (KR)

( * ) Notice: Subject to any disclaimer, the term of this patent is extended or adjusted under 35 U.S.C. 154(b) by 0 days.

(21) Appl. No.: 11/857,997

(22) Filed: Sep. 19, 2007

(65) Prior Publication Data

US 2008/0012635 A1  Jan. 17, 2008

Related U.S. Application Data

(60) Division of application No. 11/594,050, filed on Nov. 6, 2006, which is a division of application No. 10/749,810, filed on Dec. 30, 2003, now Pat. No. 7,161,422, and a continuation-in-part of application No. 10/435,529, filed on May 9, 2003, now Pat. No. 6,900,692.

(60) Provisional application No. 60/514,420, filed on Oct. 23, 2003.

(30) Foreign Application Priority Data

Jan. 3, 2003  (KR)  .................................. 2003-308

(51) Int. Cl.
*H03F 1/14* (2006.01)
(52) U.S. Cl. .................................... 330/51; 330/124 D
(58) Field of Classification Search ................ 330/51, 330/124 D, 151, 284, 302, 310
See application file for complete search history.

(56) References Cited

U.S. PATENT DOCUMENTS 3,434,070 A   3/1969  Bartnik et al.

(Continued)

FOREIGN PATENT DOCUMENTS

EP   0977354 A1   2/2000

(Continued)

OTHER PUBLICATIONS

English Abstract and drawing corresponding to Korean patent document No. 2001-0105151, 2 pages.

(Continued)

*Primary Examiner*—Henry Choe
(74) *Attorney, Agent, or Firm*—Townsend and Townsend and Crew LLP

(57) ABSTRACT

A multiple power mode amplifier provides a low and a high power mode without using switches. This amplifier may be used in radio frequency (RF) applications such as mobile telephones, pagers, portable digital assistants, and wireless e-mail devices. In the low power mode, the power consumption of the amplifier is reduced, which will increase operation time, especially important for battery-operated devices. In one implementation, the amplifier includes a number of impedance matching network units (130, 140, 150, and 160), impedance transformer (170), and a power stage (120). An implementation provides further power consumption savings by modulating a bias of an amplifier stage.

5 Claims, 33 Drawing Sheets

U.S. PATENT DOCUMENTS

| | | | |
|---|---|---|---|
| 5,152,004 A * | 9/1992 | Vaisanen et al. | 455/68 |
| 5,175,871 A * | 12/1992 | Kunkel | 455/69 |
| 5,276,912 A | 1/1994 | Siwiak et al. | |
| 5,530,923 A | 6/1996 | Heinonen et al. | |
| 5,661,434 A | 8/1997 | Brozovich et al. | |
| 5,758,269 A | 5/1998 | Wu | |
| 5,909,643 A | 6/1999 | Aihara | |
| 6,060,949 A | 5/2000 | Kaufman et al. | |
| 6,066,983 A | 5/2000 | Okoro | |
| 6,069,526 A | 5/2000 | Ballantyne | |
| 6,205,318 B1 | 3/2001 | Schindler et al. | |
| 6,356,150 B1 * | 3/2002 | Spears et al. | 330/145 |
| 6,363,685 B1 | 4/2002 | Kugler | |
| 6,374,116 B1 | 4/2002 | Peterzell et al. | |
| 6,487,419 B1 | 11/2002 | Freed | |
| 6,603,359 B2 | 8/2003 | Fujiwara et al. | |
| 6,630,861 B2 | 10/2003 | Kawaoka | |
| 6,943,631 B2 | 9/2005 | Scherrer et al. | |
| 2004/0108901 A1 | 6/2004 | Apel et al. | |

FOREIGN PATENT DOCUMENTS

| | | |
|---|---|---|
| EP | 1032120 A1 | 8/2000 |
| EP | 1229642 A1 | 8/2002 |
| EP | 1330021 A1 | 7/2003 |
| EP | 1612932 A1 | 6/2004 |
| JP | 09/036675 | 7/1987 |
| KR | 2001-0105151 | 11/2001 |

OTHER PUBLICATIONS

Patent Abstracts of Japan—English language abstract of Japanese Patent Application No. 07/181672 filed Jul. 18, 1995.

English language translation of Official Action dated Apr. 9, 2007 for Japanese Patent Appln. No. 2004/055035.

Official Action dated Apr. 9, 2007 from the Japanese Patent Office for Japanese Patent Appln. No. 2004/055035 (Japanese language).

* cited by examiner

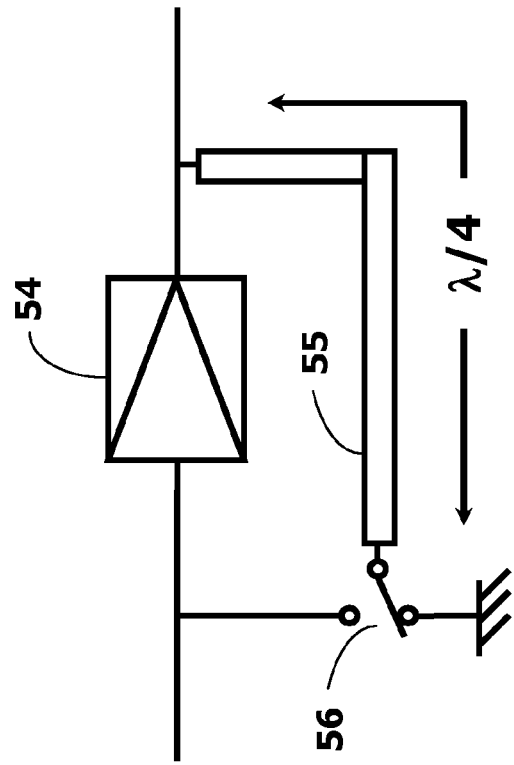
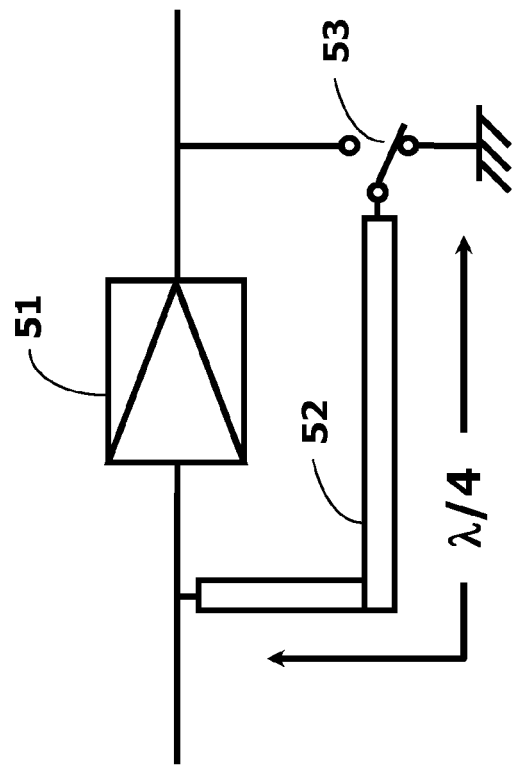

Fig. 19
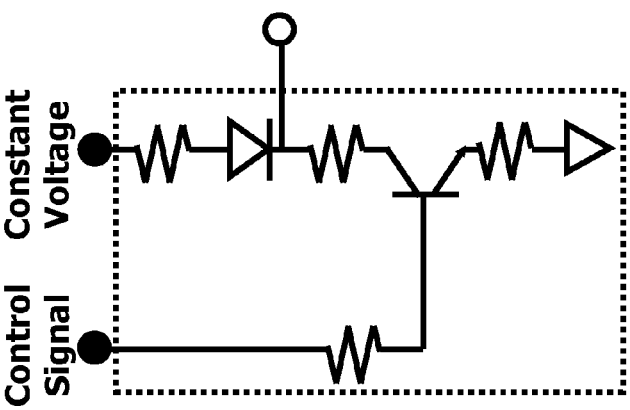
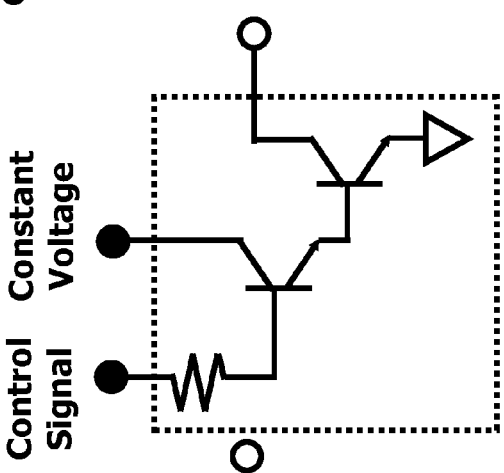
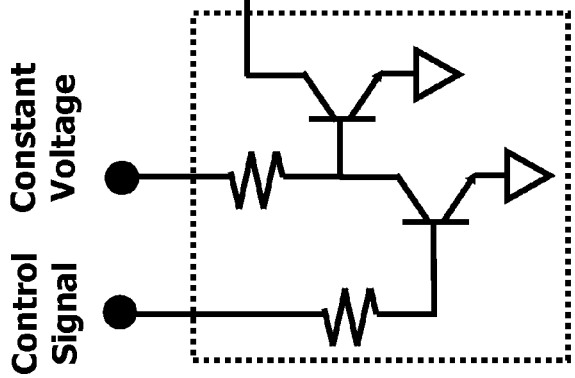
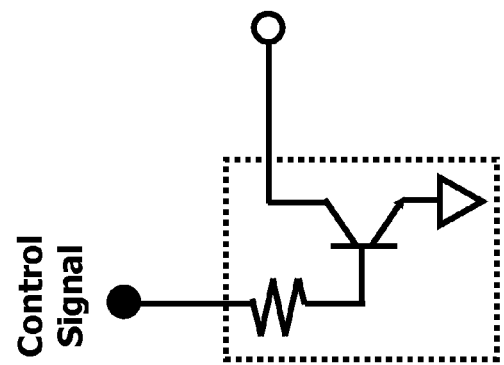
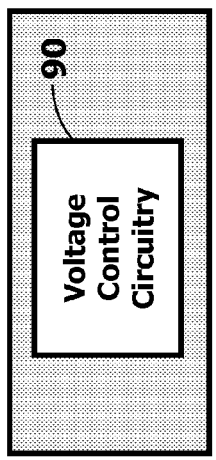

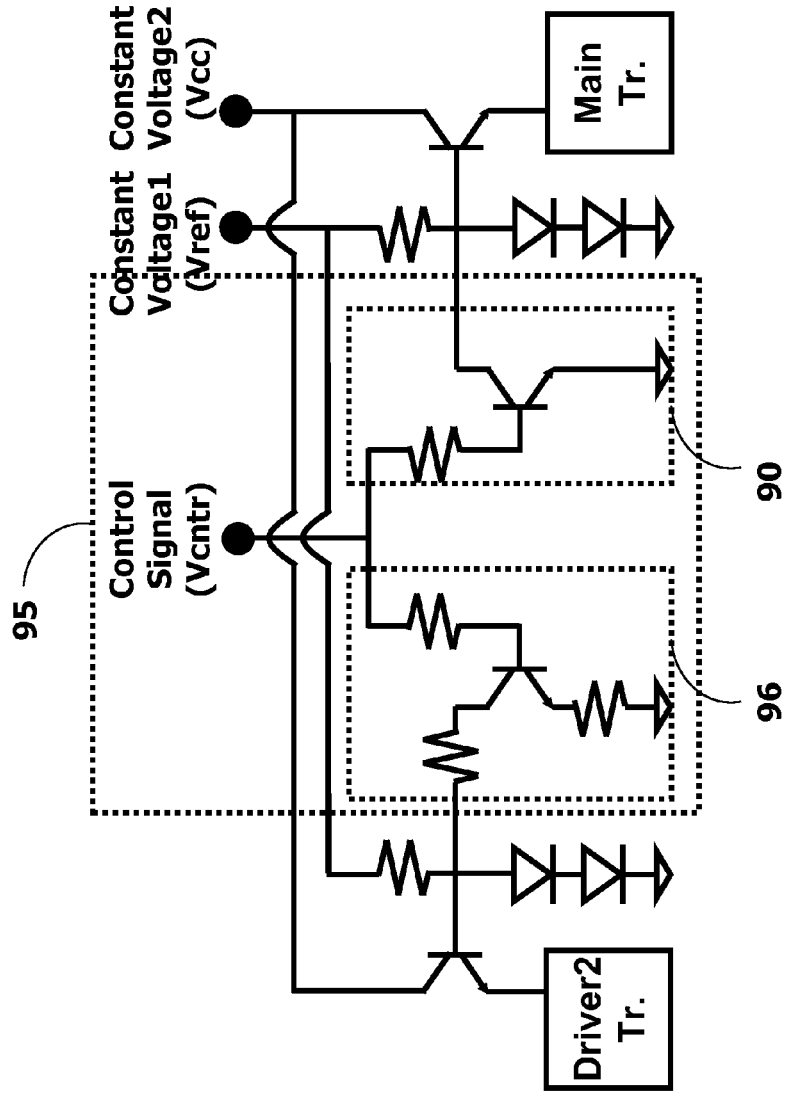
Fig. 27 Augmented voltage Control Circuitry2 (95) for Bias Modulated PAM Examples of Driver stage Control Circuitry (96)

MULTIPLE POWER MODE AMPLIFIER WITH BIAS MODULATION OPTION AND WITHOUT BYPASS SWITCHES

CROSS-REFERENCE TO RELATED APPLICATIONS

This application is a division of U.S. patent application Ser. No. 11/594,050, filed Nov. 6, 2006 which is a division of U.S. patent application Ser. No. 10/749,810, now U.S. Pat. No. 7,161,422, filed Dec. 30, 2003 which claims benefit of U.S. provisional application 60/514,420, filed Oct. 23, 2003 and is a continuation-in-part of U.S. patent application Ser. No. 10/435,529, now U.S. Pat. No. 6,900,692, filed May 9, 2003 which claims priority under 35 U.S.C. 119 to Korean patent application number 2003-308, filed on Jan. 3, 2003, which is incorporated by reference, along with all other references cited in this application.

BACKGROUND OF THE INVENTION

The present invention relates to a power amplifier, especially a radio frequency (RF) amplifier used in mobile handset and other battery-powered applications (e.g., portable wireless devices, personal digital assistants (PDAs), notebook computers, and others). More particularly, the present invention relates to a multiple power mode power amplifier with high efficiency appropriate for amplifying power corresponding to various output power levels without using bypass switching circuits.

Mobile handsets or mobile telephones (also sometimes called cell phones) for wireless communication services are becoming smaller and lighter. This also means a size of the battery, which is a typically a sizeable portion of a mobile handset, is also becoming smaller in order to facilitate a smaller and lighter mobile handset. But at the same time a telephone and its battery is becoming smaller, it is desirable to extend a talk time of a mobile handset. As can be appreciated, these are difficult goals to reconcile; if the power drain of a device remains the same and the battery is smaller, operating time of the device per battery charge becomes shorter.

In a conventional mobile handset, the radio frequency (RF) power amplifier consumes most of the power of the overall system of the mobile handset. Thus, low efficiency of the RF power amplifier degrades the efficiency of the overall system, drains the battery more rapidly, and thus reduces the talk time. For this reason, much research in this field concentrates on increasing the efficiency of the RF power amplifier. If the RF power amplifier is more efficient, this reduces power drain and the battery, which in turn increases talk time or the operating time of the device per batter charge.

A multiple power mode power amplifier is one of the devices introduced recently as a result of such research conducted to increase efficiency of the RF power amplifier. The multiple power mode power amplifier is configured to operate its own power stage corresponding to a desired situation and is operated in one of several operation modes corresponding to output power levels, as discussed in U.S. Pat. Nos. 5,152,004; 5,175,871; 5,276,912; 5,530,923; 5,661,434; 5,758,269; 5,909,643; 6,060,949; 6,069,526; and 6,356,150, all of which are incorporated by reference. Bypass switching circuits have been used for such operations of the multiple power mode power amplifier.

If low output power is required, it is desirable to adjust a path of power transmission to bypass a power stage. In contrast, if the high output power is required, it is desirable to adjust a path of power transmission to pass the power stage in order to provide high output power. Using a conventional multiple power mode power amplifier (which uses bypass switches) that selectively performs mode transition corresponding to desired output power levels, it is possible to reduce DC power consumption at the time of transferring signals of low output power.

However, the multiple power mode power amplifier with switches (e.g., PIN diodes) is relatively costly to manufacture and the switches reduce efficiency somewhat because they may have negative gain (e.g., −1 dB gain per switch). Further, more than one power stage among a plurality of power stages connected to each other in serial should be switched in order to implement the multiple power mode power amplifiers, and more than one bypass switching circuits and a complex logical control circuit for controlling the bypass switching circuits are required for the switching operation.

Power losses caused by switching operations at the bypass switching circuits causes a reduction of output power and the reduction of output power causes reduction of efficiency of the multiple power mode power amplifier. Further, there is another problem in that an adjacent channel power ratio (ACPR) gets worse. Furthermore, the size of the entire system gets larger due to bypass switching circuits themselves and the complex logical control circuit additionally added for controlling the bypass switching circuits, so that the conventional multiple power mode power amplifier is considered as regressive considering a trend towards a smaller-sized mobile handset. Also the enlarged size of the entire system is disadvantageous in price competitiveness, particularly since the switches are expensive components.

Therefore, it is a need to provide a more power efficient power amplifier, and in particular, a multiple power mode amplifier that does not use any switches.

SUMMARY OF THE INVENTION

The present invention is a multiple power mode power amplifier that amplifies power of various levels with a bypass circuit not including switches, so that problems of power loss, increased size, and increased cost associated with conventional multiple power mode power amplifier using bypass switches may be avoided. Further, the multiple power mode power amplifier of the invention reduces DC power consumption in the low power mode, so that power added efficiency (PAE) characteristics of the power amplifier is improved and operation time of a portable electronic device (e.g., talk time of a mobile handset) equipped with the present multiple power mode power amplifier may be extended.

In one embodiment, the multiple power mode amplifier uses a variable gain amplifier as a driver to minimize power loss associated with the conventional multiple power mode power amplifier in the high power mode, so that PAE characteristics in the high power mode may be improved and poor linearity in the high power mode may be solved. In addition, improvement in sound quality and size reduction of the mobile handset may be obtained in a mobile handset or telephone equipped with the present multiple power mode power amplifier.

An embodiment of the present invention solves at least the above problems of the conventional multiple power mode power amplifier using bypass switches and provides a multiple power mode power amplifier with high efficiency that may amplify power of various levels without using bypass switches by making a path for bypassing a power stage and a path for passing through a power stage joined at an optimum point and providing an optimum impedance transformer on the path for bypassing the power stage.

In an embodiment, the invention is a multiple power mode power amplifier with high efficiency including a power stage for receiving power amplified by a driver through a first impedance matching unit connected in serial to the driver amplifying input power and a second impedance matching unit connected to the first impedance matching unit, reamplifying the power and outputting the reamplified power; an applied voltage control circuit, connected to the power stage, for controlling applied voltages corresponding to a first power mode and a second power mode; an impedance transformer for receiving power amplified by the driver through the first impedance matching unit, according to operations of the applied voltage control circuit; a third impedance matching unit, connected to the power stage in serial, for receiving power amplified by the power stage, according to operations of the applied voltage control circuit; and a fourth impedance matching unit, connected to the third impedance matching unit and connected to the impedance transformer, for transferring power, transferred from the third impedance matching unit or the impedance transformer, to an output stage according to operations of the applied voltage control circuit.

According to one implementation, the power stage is connected to the second impedance matching unit in serial, and in the second power mode, the power stage receives power amplified by the driver through the second impedance matching unit and reamplifies the power.

In an implementation, the applied voltage control circuit adjusts voltage applied to the power stage in order for the power stage to be off in the first power mode and in order for the power stage to be on in the second power mode.

In an implementation, the impedance transformer is connected in a parallel branch to the second impedance matching unit, the power stage and the third impedance matching unit, and in the first power mode, the impedance transformer receives through the first impedance matching unit the power amplified by the driver and outputs the power to the fourth impedance matching unit. Further, in a specific implementation, the impedance transformer has the structure of a band-pass filter. In its other implementation, the impedance transformer may be any type of band-selective filter including band-pass, band reject, low pass, or high pass.

In an implementation, the third impedance matching unit prevents power transferred through the impedance transformer from leaking to the power stage.

In an implementation, the fourth impedance matching unit receives power from the impedance transformer in the first power mode and the fourth impedance matching unit receives power from the third impedance matching unit in the second power mode.

In an implementation, a path, that power which passed through the first impedance matching unit is transferred to the fourth impedance matching unit, is determined by comparing impedance as viewed from the first impedance matching unit towards the power stage and impedance as viewed from the first impedance matching unit towards the impedance transformer.

In an implementation, the impedance as viewed from the first impedance matching unit towards the impedance transformer forms a part of an interstage matching unit between the driver and the power stage together with the first impedance matching unit in the second power mode.

In another embodiment, a multiple power mode power amplifier with high efficiency includes a driver for variably amplifying gain of input signal using a variable gain amplifier; a power stage for receiving power amplified by the driver through a first impedance matching unit connected to the driver in serial and a second impedance matching unit connected to the first impedance matching unit, reamplifying the power and outputting the reamplified power; an applied voltage control unit, connected to the power stage, for controlling an applied voltage corresponding to the first power mode and the second power mode; an impedance transformer for receiving through the first impedance matching unit power amplified by the driver according to operations of the applied voltage control circuit; a third impedance matching unit, connected to the power stage in serial, for receiving power amplified by the power stage according to operations of the applied power control circuit; and a fourth impedance matching unit, connected to the third impedance matching unit and connected to the impedance transformer, for transferring the power transferred from the third impedance matching unit or the impedance transformer, to an output stage according to operations of the applied voltage control circuit.

In an implementation, the power stage is connected to the second impedance matching unit in serial, and in the second power mode, the power stage receives through the second impedance matching unit power amplified by the driver and reamplifies the power.

In an implementation, the applied voltage control circuit controls the driver in order for gain of signal inputted into the driver to be differently amplified corresponding to the first power mode and the second power mode. The applied voltage control circuit adjusts voltage applied to the power stage in order for the power stage to be off in the first power mode and in order for the power stage to be on in the second power mode.

The amplifiers may have more than two power modes. For example, the amplifier may have three, four, five, six, or even greater number of modes, such as several different power modes using various amounts of power.

In an implementation, the impedance transformer is connected in parallel to a circuit branch including the second impedance matching unit, the power stage, and the third impedance matching unit, and in the first power mode, the impedance transformer receives through the first impedance matching unit power amplified by the driver and outputs the power to the fourth impedance matching unit. The impedance transformer has the structure of a band-pass filter. In its other implementation, the impedance transformer may be any type of band-selective filter including band-pass, band reject, low pass, or high pass.

In an implementation, the third impedance matching unit prevents power transferred through the impedance transformer from leaking to the power stage.

In an implementation, the fourth impedance matching unit receives power from the impedance transformer in the first power mode and the fourth impedance matching unit receives power from the third impedance matching unit in the second power mode.

In an implementation, a path, for power passing through the first impedance matching unit to the fourth impedance matching unit is determined by comparing an impedance as viewed from the first impedance matching unit towards the power stage and impedance as viewed from the first impedance matching unit towards the impedance transformer.

In an implementation, the impedance as viewed from the first impedance matching unit towards the impedance transformer forms a part of an interstage matching unit between the driver and the power stage together with the first impedance matching unit in the second power mode.

In one embodiment, a multiple power mode amplifier configured for use in a portable electronic device includes a driver to provide power. A power stage transistor includes an input node and an output node. The input node of the power stage transistor is coupled to the driver to receive the power from the driver in a high power mode. An impedance transformer includes an input node and an output node and is provided in a parallel branch to the power stage transistor. The input node of the impedance transformer is configured to receive the power from the driver in a low power mode.

In another embodiment, a portable electronic device includes a power source and a power amplifier coupled to the power source. The power amplifier includes a driver to provide power; a power stage transistor including an input node and an output node, the input node of the power stage transistor being coupled to the driver to receive the power from the driver and configured to receive power from the driver in a high power mode; and an impedance transformer including an input node and an output node and provided in a parallel branch to the power stage transistor, the input node of the impedance transformer being configured to receive the power from the driver in a low power mode.

In another embodiment, a multiple power mode amplifier configured for use in a mobile phone includes a driver to provide power; a power stage transistor including an input node and an output node, the input node of the power stage transistor being coupled to the driver and being configured to receive the power from the driver during a high power mode operation; a first impedance matching unit coupled to the driver to receive the power output by the driver; a second impedance matching unit provided between the first impedance matching unit and the power stage transistor; an impedance transformer including an input node and an output node and provided in a parallel branch to the power stage transistor, the input node of the impedance transformer being configured to receive the power from the first impedance matching unit during a low power mode operation; a third impedance matching unit having a first side and a second side, the first side of the third impedance matching unit being coupled to the output node of the power stage transistor; and a fourth impedance matching unit being coupled to the second side of the third impedance matching unit and the output node of the impedance transformer.

In yet another embodiment, a multiple power mode power amplifier includes a power stage transistor configured to receive first power from a driver via first and second impedance matching units during a high power mode and output second power that is greater than the first power; an applied voltage control circuit coupled to the power stage transistor and configured to apply a first signal to the power stage transistor during the high power mode to turn on the power stage transistor and apply a second signal to the power stage transistor during a low power mode to turn off the power stage transistor; an impedance transformer configured to receive third power from the driver via the first impedance matching unit during the low power mode, the third power being less than the second power; a third impedance matching unit coupled to the power stage transistor in series and configured to receive the second power output by the power stage transistor during the high power mode; and a fourth impedance matching unit coupled to the third impedance matching unit in series and configured to receive the second power from the third impedance matching unit or third power from the impedance transformer and transfer the received second or third power to an output stage.

According to another aspect, the invention includes the use of an amplifier circuit having multiple modes and without switches in a wireless transmitter or transceiver device such as a mobile telephone. The invention includes the use of an amplifier circuit having multiple modes and without switches to extend transmit time of a portable wireless device. The invention includes the use of an amplifier circuit having multiple modes and without switches to increase the battery life of a portable wireless device. The invention includes the use of an amplifier circuit having two or more modes without switches to operate in a low power or a high power mode depending on a distance to a receiving antenna, thus improving efficiency and reducing power consumption. The invention includes the use of a change in an impedance of a power stage to change from a low power mode to a high power mode, or vice versa, without using switches. The invention includes the use of impedance network to change from one power mode to another power mode for an amplifier without switches.

Another aspect of the invention is to provide a bias modulation circuit to change the biasing to an amplifier to reduce its power consumption. This is different from the technique of switching an amplifier so it is off. By changing the biasing of an amplifier, its mode of operation may be changed so it operates in class AB mode closer to class B than class A. With this technique, power consumption in the low power mode is further reduced for an amplifier module over an amplifier module without the bias modulation circuit.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 3A illustrates a conventional multiple power mode power amplifier using a bypass switch, of which the switch is connected to an output terminal of λ/4 bypass transmission line.

FIG. 3B illustrates a conventional multiple power mode power amplifier using a bypass switch, of which the switch is connected to an input terminal of λ/4 bypass transmission line.

FIG. 19 shows various different circuit arrangements for the voltage control circuitry.

FIG. 27 shows more detailed circuit diagram of the scheme of FIG. 26B respectively.

DETAILED DESCRIPTION OF THE INVENTION

Figure 1:
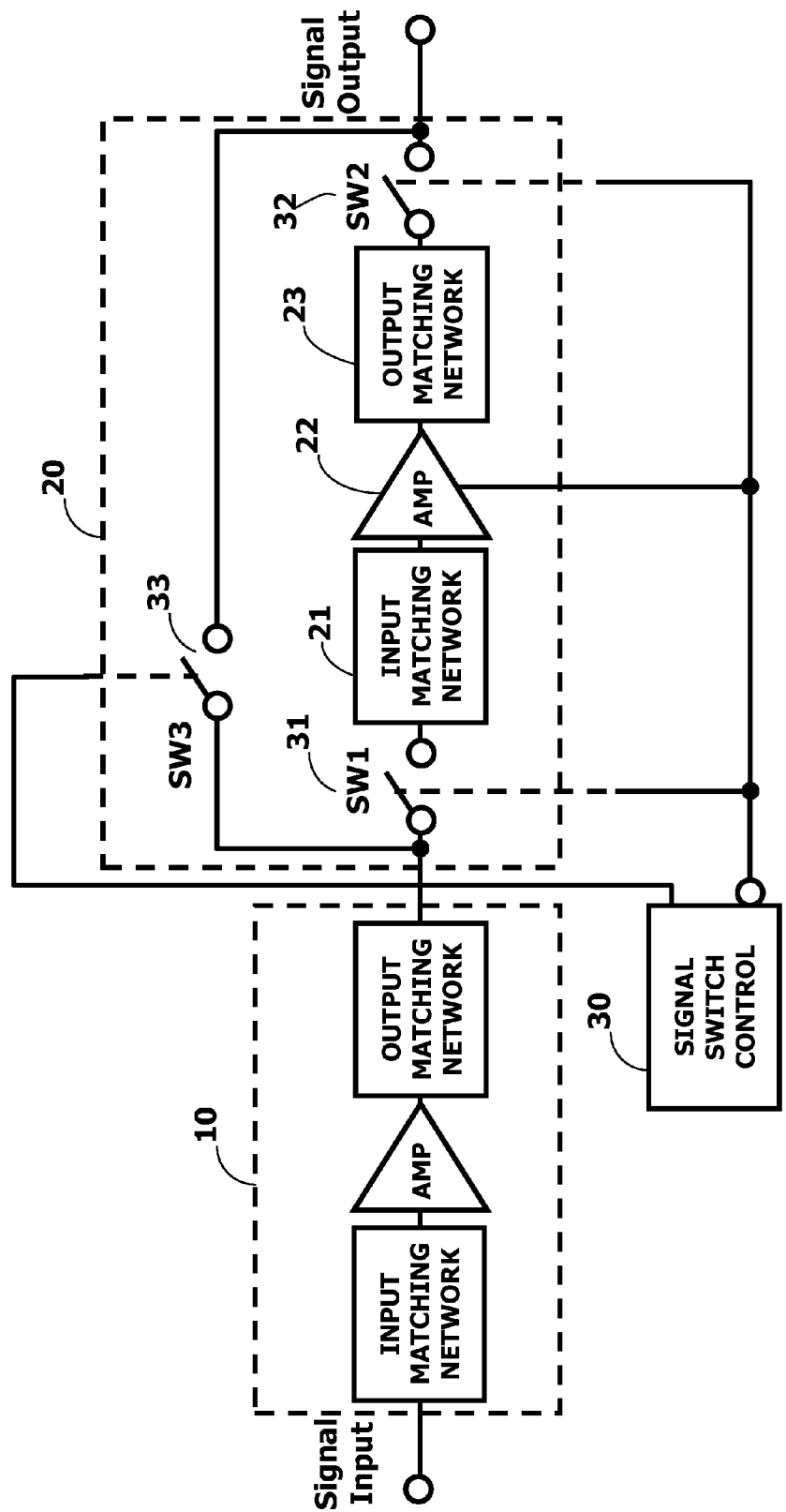
FIG. 1 illustrates a conventional multiple power mode power amplifier using bypass switches.

FIG. 1 illustrates a conventional multiple power mode power amplifier using bypass switches or bypass switch circuits. The multiple power mode power amplifier illustrated in FIG. 1 is configured using three bypass switch circuits.

If the power amplifier is operated in the high power mode, both a first switch 31 and a second switch 32 are closed and a third switch 33 is open, so that output of a driver 10 including an impedance matching unit is input into a power stage 22 (or power amplifying component). In contrast, if the power amplifier is operated in the low power mode, both the first switch 31 and the second switch 32 are open and the third switch 33 is closed, so that output of the driver 10 including the impedance matching unit bypasses the power stage 22.

The multiple power mode amplifier illustrated in FIG. 1 has disadvantages in that the size of the entire system increases and power loss of the entire system increases due to power loss of the bypass switch circuits. Especially, power loss of the second switch 32 connected to an output terminal of the power stage affects greatly the efficiency and linearity of the operation in the high power mode, so that a bypass switch circuit having great power capacity and excellent loss characteristic should be used; however, the use of a bypass switching circuit with a large power handling capability and extremely low power loss requires high cost.

For example, a typical switch may be a PIN diode that has a −1 dB gain. When there are multiple switches in series (i.e., serial switches), the gain loss is cumulative. Also PIN diodes are typically not integrated with the amplifier, which increases the number of integrated circuits (ICs) or chips or components needed. This increases cost. Also, PIN diodes themselves are relatively costly to include in a circuit. Some examples of other types of switches are relays, micromachined switches, transistor switches, PIN diode switches, and Schottky diode switches.

A switch can be made out of active or passive devices. Some common active device switches are PIN diodes, Schottky diodes, and transistors. The term "active" means that DC supply and power consumption are needed for the device to operate properly.

A switch may also be implemented using passive devices such as mechanical relays. Also, recently with the development of MEMS (microelectromechanical system) technology, the micromachined mechanical switches are also possible, which can be used in the integrated circuits. For passive switches, no power consumption is needed, but control DC signals are still needed for operation.

All in all, these can all be categorized as switches or switch devices, and they share three distinct features. They add loss to the signals and add cost to the whole system. Also, external control signals are needed to turn on and off the switches.

Figure 2:
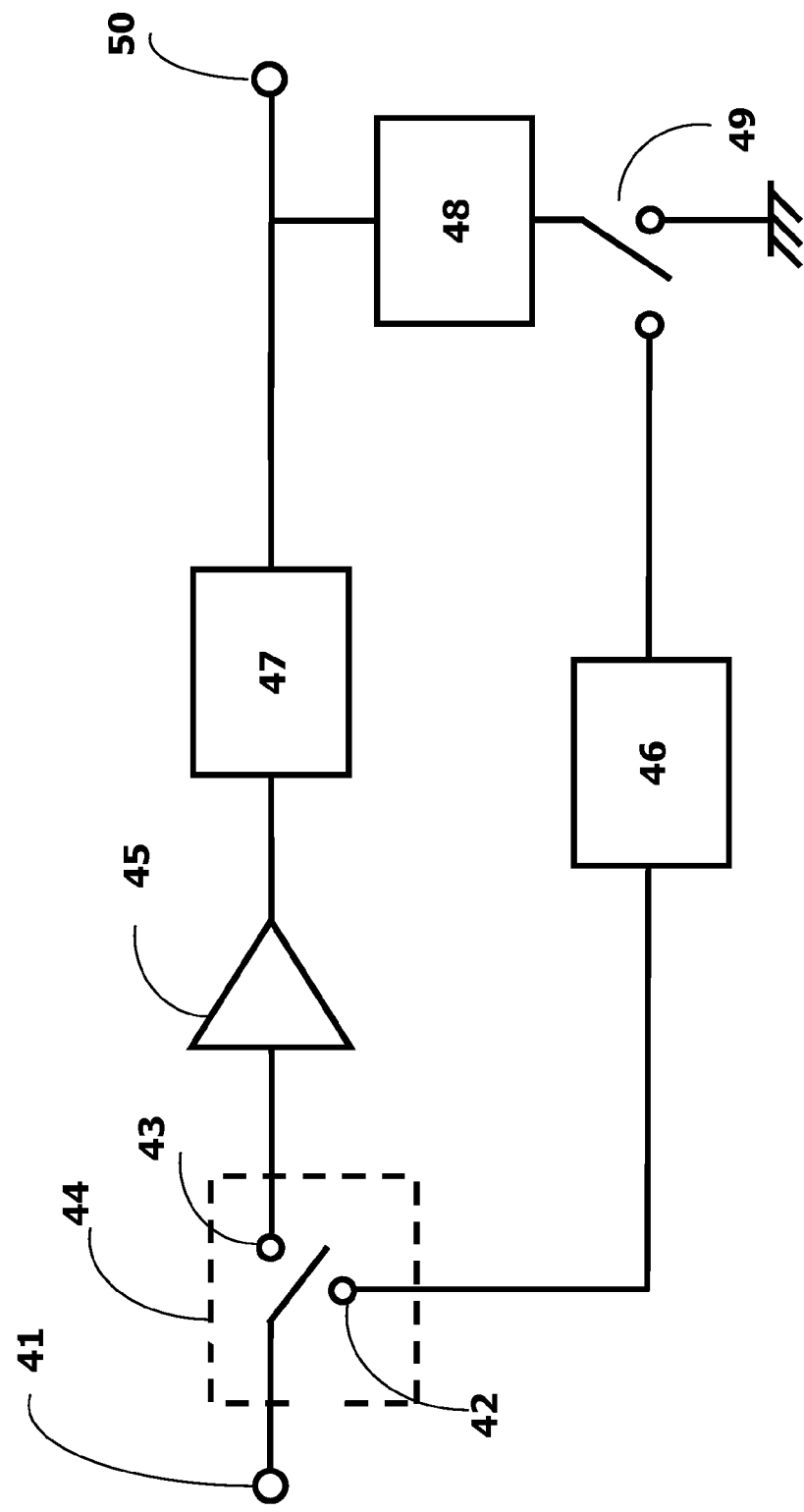
FIG. 2 illustrates a conventional multiple power mode power amplifier using other bypass switches.

FIG. 2 illustrates a conventional multiple power mode power amplifier using other bypass switch circuits. The multiple power mode power amplifier illustrated in FIG. 2 is configured using a combination of a SPDT (single-pole and double-throw) switch and a shunt (not serial) switch in the bypass path.

An input signal to be amplified is coupled to a pole 41 of a switch 44. The switch 44 can be operated so as to couple the input signal at pole 41 to either throw 42 or to throw 43. The throw 43 is coupled to the input of a power amplifying stage 45. The output of the power amplifying stage 45 is coupled to a first side of a first impedance-transforming unit 47. A second side of the unit 47 is coupled to an output node 50. The throw 42 is coupled to a first side of a second impedance-transforming unit 46. A third impedance transforming unit 48 has a first side directly coupled to the second side of impedance transforming network 47 and to the output node 50. A second side of the impedance transforming unit 48 is switched by a switch 49 between a second side of impedance transforming unit 46 and ground.

The operation of switch 49 is coordinated with the operation of switch 44. The impedance transforming units have impedance values selected so that in a high power mode, i.e., when the input signal is coupled via the switch 44 to the amplifying stage 45, the output of the amplifying stage 45 sees the correct load impedance through the impedance transforming unit 47. When operating in a low power mode, i.e., when switch 44 connects to the throw 42 and routes the input signal via the impedance transforming unit 46, the input signal also sees the correct load impedance through the impedance transforming unit 46.

Since the power amplifier illustrated in FIG. 2 should use at least two single pole double-throw (SPDT) switches, characteristic gets worse due to inherent losses of the switches and manufacturing costs also increases due to use of relatively expensive switches and a bigger power amplifying stage.

FIG. 3*a* illustrates a conventional multiple power mode power amplifier using a bypass switch circuit, of which switching circuit is connected to an output terminal of λ/4 bypass transmission line. The multiple power mode power amplifier illustrated in FIG. 3*a* includes a carrier amplifier 51 and has a bypass implemented by a bypass switch circuit configured by using λ/4 bypass transmission line 52 and a shunt switch 53.

In a high power mode, the shunt switch 53 of the bypass switch circuit is connected to the ground and the bypass switching circuit including the shunt switch 53 is operated as a short-circuited stub by being connected to the λ/4 bypass transmission line 52, and presents an open circuit seen from the carrier amplifier.

In a low power mode, the shunt switch 53 of the bypass switching circuit is connected to an output terminal of the carrier amplifier 51 and is operated as a bypass together with the λ/4 bypass transmission line 52.

FIG. 3*b* illustrates a conventional multiple power mode power amplifier using a bypass switch circuit, of which the switch circuit is connected to an input terminal of λ/4 bypass transmission line.

A difference between the multiple power mode power amplifier illustrated in FIG. 3*b* and the multiple power mode power amplifier illustrated in FIG. 3*a* is only the order of a λ/4 bypass transmission line and a bypass switch circuit.

Since the multiple power mode power amplifier illustrated in FIGS. 3*a* and 3*b* includes only one bypass switch circuit, it has an advantage in that the size of the entire system is small. However, at the same time, it has a disadvantage in that bandwidth is limited due to use of a λ/4 bypass transmission line and requires a large area to accommodate the long transmission line.

Figure 4:
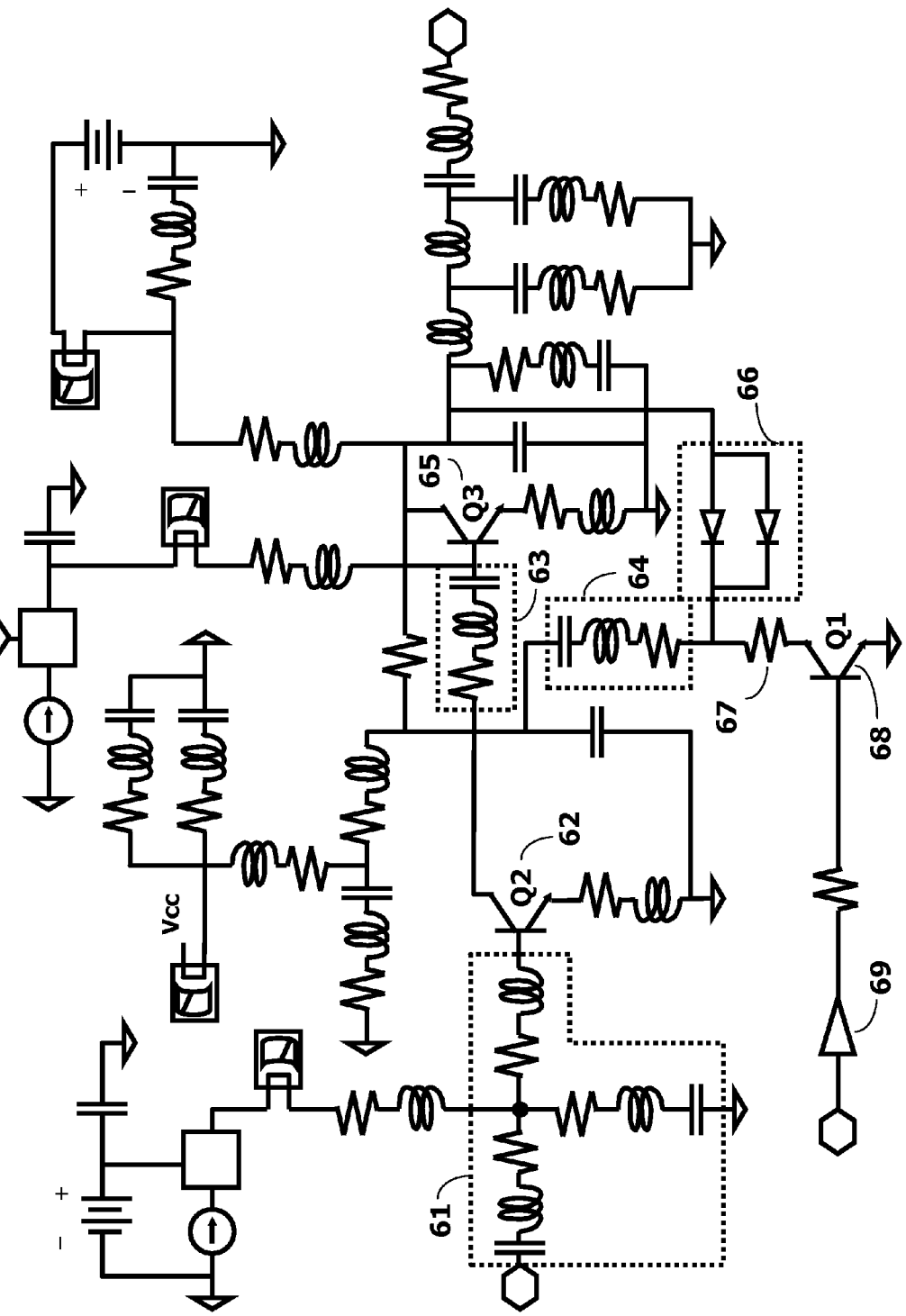
FIG. 4 illustrates a conventional multiple power mode power amplifier using other bypass switches.

FIG. 4 illustrates a conventional multiple power mode power amplifier using other bypass switch circuits. The power amplifier includes an input stage transistor 62, an output amplifier stage transistor 65, a serial switch 66 comprising two parallel diodes, and a switching transistor 68.

In a high power mode, the switching transistor 68 is off and the serial switch 66 is open. Accordingly, output of the input stage transistor 62 is inputted into the output stage transistor 65 and a first impedance matching unit 63 that transforms input impedance into impedance of 15 ohms.

In a low power mode, base bias of the output stage transistor 65 is off and the switching transistor 68 is on, so that the switch 66 is closed. A second impedance matching unit 64 transforms load impedance into impedance of 25 ohms. The second impedance matching unit 64 has smaller impedance than input impedance of the output stage transistor 65 when the switch 66 is closed and has bigger impedance than input impedance of the output stage transistor 65 when the switch 66 is open. Thus, the second impedance matching unit 64 operates as a bypass.

In the following part of this patent, a detailed explanation is given with reference to the attached drawings as to the multiple power mode power amplifier with high efficiency in accordance with embodiments of the present invention. As used in the application, a first power mode is also referred to as the low power mode, and a second power mode is also referred as the high power mode.

Figure 5:
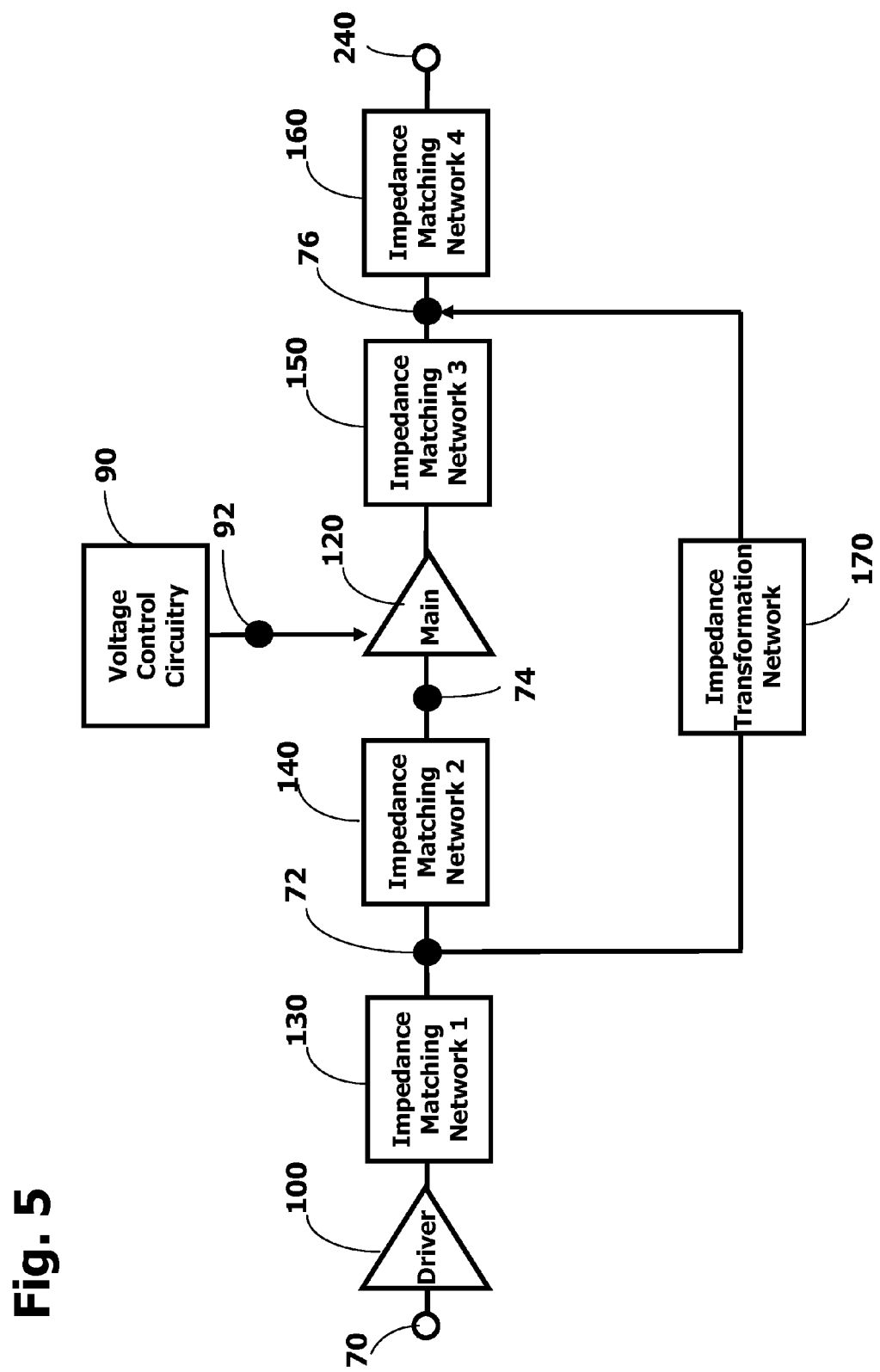
FIG. 5 illustrates a multiple power mode power amplifier with high efficiency using power mode transition structure without a bypass switch according to one embodiment of the present invention.

FIG. 5 illustrates a multiple power mode power amplifier with high efficiency using power mode transition structure without a bypass switch circuit according to one embodiment of the present invention. In other words, the amplifier does not include any switches or switch devices in its circuitry. As has been mentioned above, some examples of switches include relays, micromachined switches, transistor switches, PIN diode switches, and Schottky diode switches.

The approach of the present invention does not use any switches and is free from external control circuits provided to control the switches and the added cost and loss due to having switches. This allows one to implement a circuit such as a multiple mode amplifier in a compact, simple manner and a cost-effective way. Further, no loss means that the performance (i.e., linearity and efficiency) can be maximized. Although described respect to a multiple mode amplifier, techniques of the present invention may be applied to other types of circuit besides amplifiers.

The multiple power mode power amplifier with high efficiency illustrated in FIG. 5 includes: a driver 100 for amplifying input power; a power stage 120 for receiving power amplified by the driver 100 through a first impedance matching unit 130 connected to the driver and a second impedance matching unit 140 connected to the first impedance matching unit 130, reamplifying the power and outputting the reamplified power; an applied voltage control circuit 90, connected to the power stage 120, for controlling applied voltages corresponding to the low power mode and the high power mode; an impedance transformer 170 for receiving power amplified by the driver 100 through the first impedance matching unit 130, according to operations of the applied voltage control circuit 90 and transferring the power to a fourth impedance matching unit 160; a third impedance matching unit 150, connected to the power stage 120 in serial, for transferring power amplified by the power stage 120 to the fourth impedance matching unit 160; and the fourth impedance matching unit 160, connected to the third impedance matching unit 150 and connected to the impedance transformer 170, for transferring power, transferred from the third impedance matching unit 150 or the impedance transformer 170, to an output stage 78 according to operations of the applied voltage control circuit 90.

As will be explained below, in one embodiment, the power stage 120 includes one or more transistors to regulate the flow of power through it. The power stage 120 may also amplify the power received from the driver 100 during high power mode operation. Accordingly, the power stage 120 may also refer to a "power amplifier stage" or "power stage transistor." In an embodiment, the power stage includes one or more transistors. Further details are provided below. A transistor to amplify a signal in the signal path may be called a power stage transistor. This transistor may include one or more transistors connected in parallel.

The applied voltage control circuit 90 adjusts a voltage applied to the power stage 120 by exterior control signal inputs corresponding to the low power mode and the high power mode. Since output power is reduced in the low power mode by passing through not the power stage 120, but the optimized first impedance matching unit 130 and the optimized impedance transformer 170, the applied voltage control circuit 90 adjusts the voltage applied to the power stage 120 in order for transistors of the power stage 120 to be off. This reduces power consumption.

In contrast, in the high power mode, since output power is increased by passing through the first impedance matching unit 130, the second impedance matching unit 140 and the power stage 120, the applied voltage control circuit 90 applies voltage appropriate for operations of transistors of the power stage 120. This increases power consumption.

In the low power mode, the driver 100 amplifies input power and transfers the amplified power to the impedance transformer 170 through the optimized first impedance matching unit 130. In contrast, in the high power mode, the driver 100 amplifies input power and transfers the amplified power to the power stage 120 through the optimized first impedance matching unit 130 and the optimized second impedance matching unit 140.

The power stage 120 in the low power mode is turned off by the applied voltage control circuit 90, while in the high power mode, the power stage 120 is turned on and amplifies the signal to be transmitted, amplified by the driver 100 and inputted into the power stage 120.

The first impedance matching unit 130 is a circuit optimized for optimal operations corresponding to the low power mode and the high power mode. The first impedance matching unit 130 transfers input power amplified by the driver 100 corresponding to the operation mode to the impedance transformer 170 or the power stage 120.

The second impedance matching unit 140 is a circuit optimized for optimal operations corresponding to the low power mode and the high power mode. In the low power mode, the second impedance matching unit 140 routes power, amplified by the driver 100 and transferred through the first impedance matching unit 130, to the impedance transformer 170 and in the high power mode, to the power stage 120. In the high power mode, the second impedance matching circuit acts also as an interstage matching circuit, allowing high efficiency power transfer from the driver to the power stage. The second impedance matching unit works in conjunction with the first impedance unit and impedance transformer for this purpose to provide power matching.

The impedance transformer 170 is an impedance transforming circuit that transforms impedance appropriately corresponding to the low power mode or the high power mode. In the low power mode, the impedance transformer 170 forms a path that bypasses the power stage 120, so that output of the driver 100 is transferred through node 76 to output 78 of the power amplifier.

Figure 6:
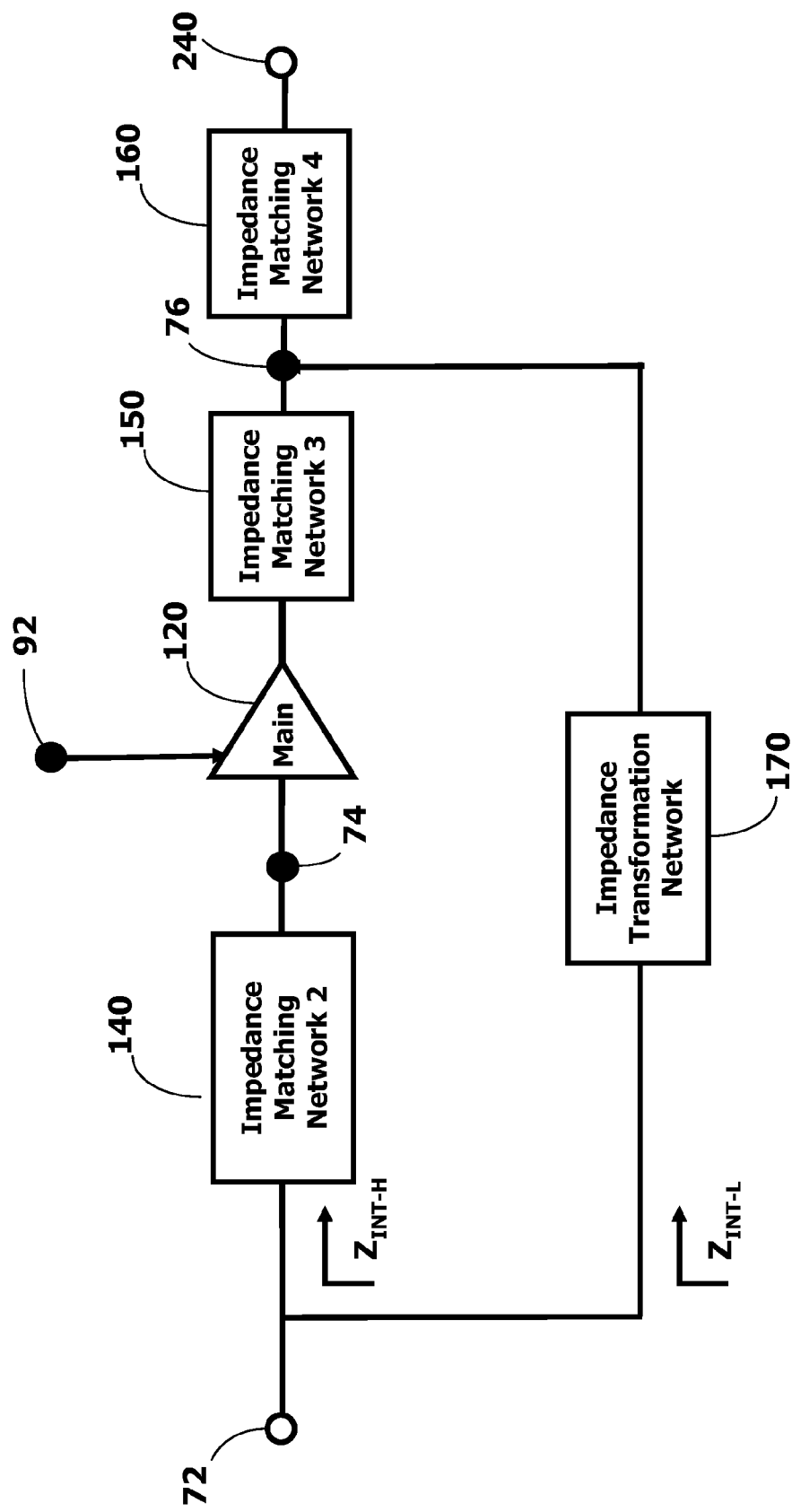
FIG. 6 illustrates the multiple power mode power amplifier with high efficiency illustrated in FIG. 5 in detail for explaining power mode transition structure without a bypass switch.

FIG. 6 illustrates the multiple power mode power amplifier with high efficiency illustrated in FIG. 5 in more detail for explaining the power mode transition structure without bypass switching circuit.

Output power of the driver 100 reaches a junction 72. At junction 72, the path divides corresponding to power modes via the first impedance matching unit 130.

In the low power mode, the power stage 120 is off by voltage applied by the applied voltage control circuit 90, and input impedance $Z_{INT-H}$ of the power stage 120 as viewed from the first impedance matching unit 130 (see FIG. 5) is larger than input impedance $Z_{INT-L}$ of a path bypassing the power stage 120 as viewed from the first impedance matching unit 130. The input impedance $Z_{INT-H}$ may be significantly or substantially larger than the input impedance $Z_{INT-L}$. In an implementation, $Z_{INT-H}$ is about two times larger than $Z_{INT-L}$. In an implementation, $Z_{INT-H}$ is about three times larger than $Z_{INT-L}$. In an implementation, $Z_{INT-H}$ is more than two times larger than $Z_{INT-L}$. In an implementation, $Z_{INT-H}$ is more than three times larger than $Z_{INT-L}$. In an implementation, $Z_{INT-H}$ is in a range from about two to about three times larger than $Z_{INT-L}$. In an implementation, $Z_{INT-H}$ is less than about three times larger than $Z_{INT-L}$. In an implementation, $Z_{INT-H}$ is greater than two larger than $Z_{INT-L}$, but less than about three times larger than $Z_{INT-L}$.

The design of impedance transformer 170 is optimized in conjunction with the third impedance matching unit 150 and the fourth impedance matching unit 160 to lower the impedance level as viewed from the first impedance matching unit 130 in the low power mode. Thus, a power signal amplified by the driver 100 and transferred to the junction 72 is optimized so that the amount of power inputted into the impedance transformer 170 is significantly or substantially larger than the amount of power inputted into the power stage 120. The output power signal is transferred to the output stage 78 with minimizing power leakage to the power stage by impedance transforming action of 170 in conjunction with the third impedance matching unit 150 and the fourth impedance matching unit 160.

In the high power mode, the power stage 120 is on, controlled by a voltage applied by the applied voltage control circuit 90, and input impedance $Z_{INT-H}$ of the power stage 120 as viewed from the first impedance matching unit 130 is smaller than input impedance $Z_{INT-L}$ of a path bypassing the power stage 120 as viewed from the first impedance matching unit 130. The impedance transformer 170 is optimally designed in conjunction with the third impedance matching unit 150 and the fourth impedance matching unit 160 to increase $Z_{INT-L}$ of a bypass path well above $Z_{INT-H}$ of the power stage 120 in the high power mode. The second impedance matching unit 140 is designed to boost up the impedance level as viewed from the first impedance matching unit 130 while providing interstage matching in the high power mode. Thus, most power, amplified by the driver 100 and transferred to the junction 72, is amplified by the power stage 120 and is transferred to the output stage 78 of the power amplifier, while minimizing power leakage to the impedance transformer 170 by the optimized third impedance matching unit 150 and the optimized fourth impedance matching unit 160.

Input impedance $Z_{INT-L}$ of a path bypassing the power stage 120 as viewed from the first impedance matching unit 130 forms an interstage matching unit between the driver 100 and the power stage 120 together with the first impedance matching unit 130 and the second impedance matching unit 140 in the high power mode, so that output power of the driver 100 is well transferred to the power stage 120 without power reflections.

In the high power mode, the input impedance Z INT-L may be significantly or substantially larger than the input impedance Z INT-H. In an implementation, Z INT-L is about two times larger than Z INT-H. In an implementation, Z INT-L is about three times larger than Z INT-H. In an implementation, Z INT-L is more than two times larger than Z INT-H. In an implementation, Z INT-L is more than three times larger than Z INT-H. In an implementation, Z INT-L is in a range from about two to about three times larger than Z INT-H. In an implementation, Z INT-L is less than about three times larger than Z INT-H. In an implementation, Z INT-L is at least two times larger than Z INT-H, but less than about three times larger than Z INT-H.

In the low power mode, the power stage is in what may be referred to as an off state, and in the high power mode, the power stage is in what may be referred to as an on state. In the on state, the power stage consumes significantly more power than in the off state. Furthermore, in an implementation, an input impedance to the power stage is about two times larger in the off state as compared to the on state. In an implementation, an input impedance to the power stage is greater than about two times larger in the off state as compared to the on state.

Figure 7B:
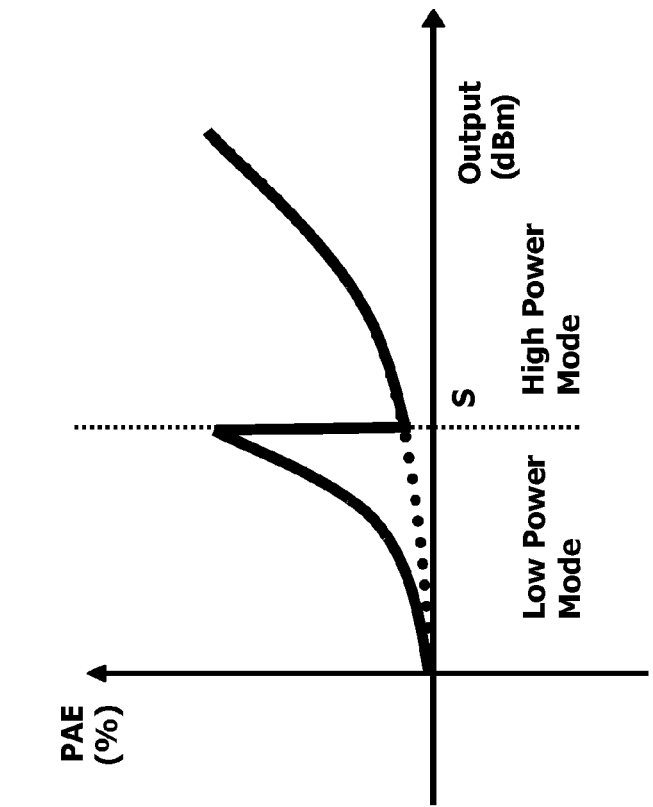
FIG. 7B is a graph illustrating power added efficiency (PAE) characteristic corresponding to the high power mode and the low power mode of the multiple power mode power amplifier according to one embodiment of the present invention.
Figure 7A:
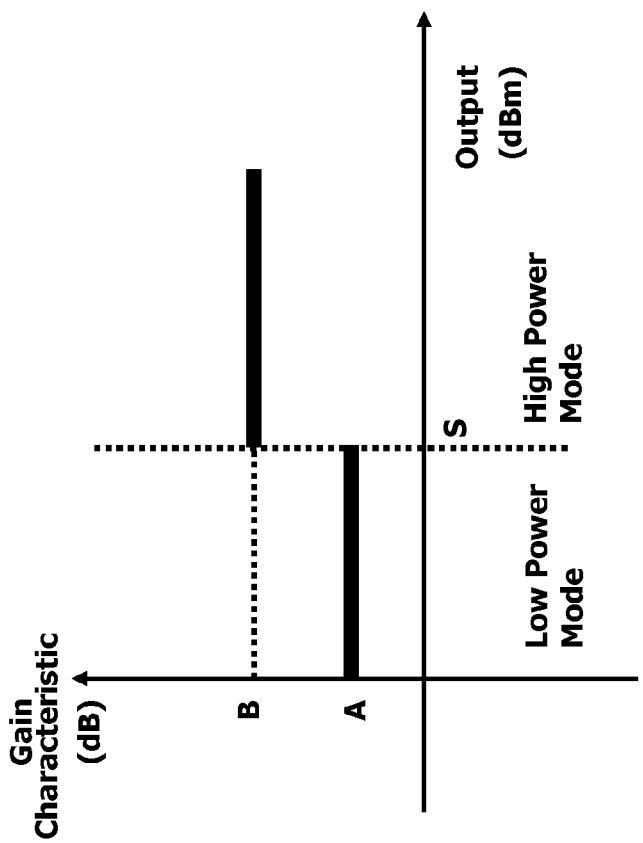
FIG. 7A is a graph illustrating gain characteristic corresponding to the high power mode and the low power mode of the multiple power mode power amplifier according to one embodiment of the present invention.

FIG. 7a is a graph illustrating a gain characteristic corresponding to the high power mode and the low power mode of the multiple power mode power amplifier according to one embodiment of the present invention.

In the low power mode, the power stage 120 is off, controlled by the applied voltage control circuit 90, so that an output of the driver 100 is not amplified by the power stage 120 and the output of the driver 100 is transferred to the output stage 78 through the impedance transformer 170. Thus, the gain characteristic is different from that when the output of the driver 100 is amplified by the power stage 120. The dotted line shows the gain when the power stage is on, while the solid line shows the gain when the power stage is off. In the low power mode, DC power is not consumed by the power stage 120, so that power added efficiency (PAE) characteristic is excellent. PAE is ((Pout−Pin)/Pdc). In FIG. 7b, the PAE when the power stage is on is shown by the dotted line, and when the power stage is off, the PAE is the solid line. Using the techniques of the invention, the amplifier has an excellent PAE in low power mode.

In contrast, in the high power mode, an output of the driver 100 is amplified by the power stage 120 and reaches the output stage 78 so that a power gain is added to the output of the driver 100 and the PAE characteristic depends on the power stage 120 that has generally high output power level.

Accordingly, as illustrated in FIG. 7a, a gain characteristic is comparatively low (i.e., gain of A) in the low power mode and gain characteristic is comparatively high (i.e., gain of B) in the high power mode.

FIG. 7b is a graph illustrating a power added efficiency (PAE) characteristic corresponding to the high power mode and the low power mode of the multiple power mode power amplifier according to one embodiment of the present invention.

As illustrated in FIG. 7b, a PAE characteristic in the low power mode (see solid line) is excellent because DC power consumption by the power stage 120 can be removed. In the high power mode, output of the power stage 120 is transferred to the output stage 78 through the third impedance matching unit 150 and the fourth impedance matching unit 160, and the third impedance matching unit 150, the fourth impedance matching unit 160 and the impedance transformer 170 do not use a switch, so that output of the power stage 120 is transferred to the output stage 78 without loss and thus PAE characteristic in the high power mode is excellent.

Figure 8:
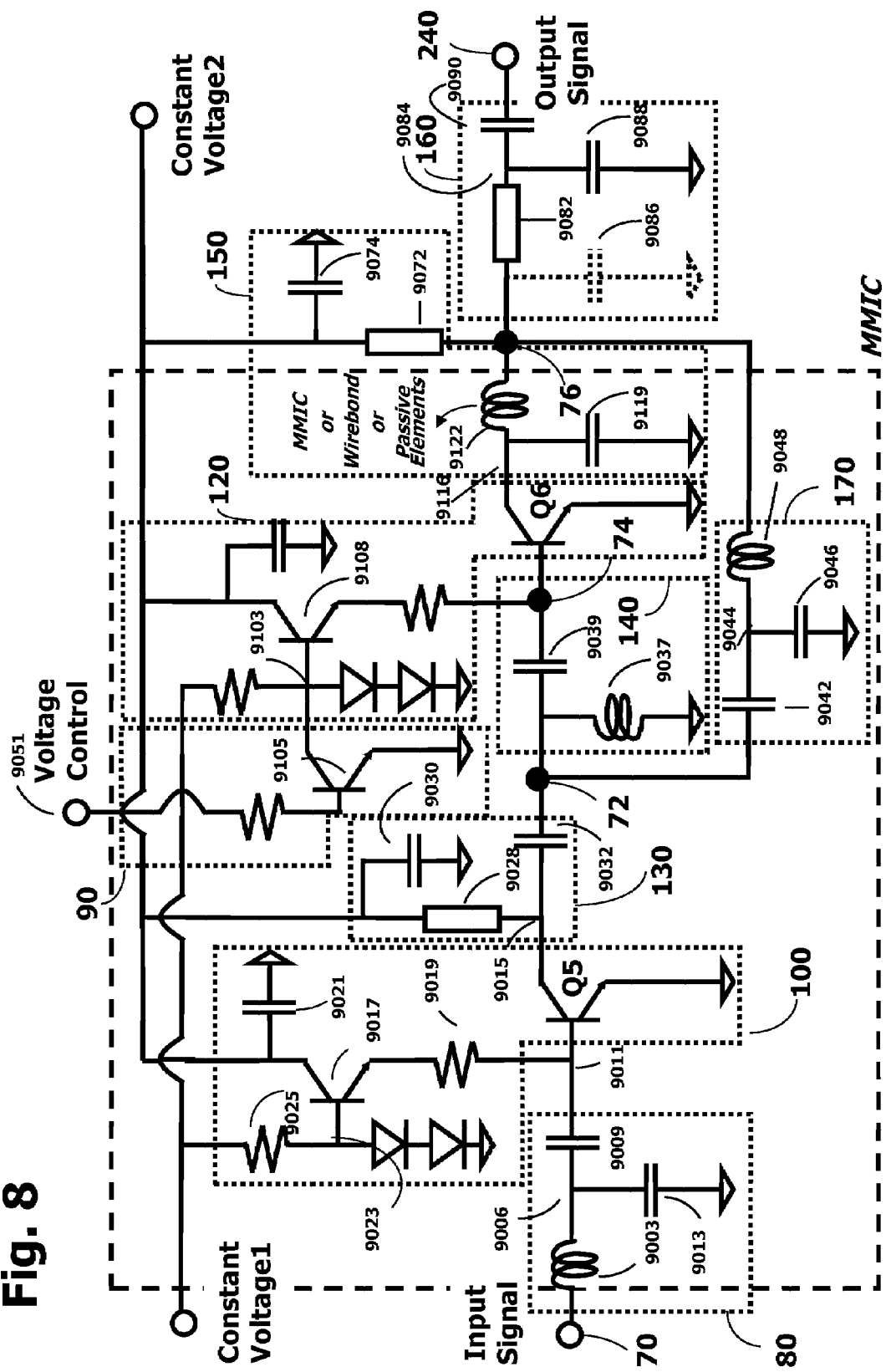
FIG. 8 shows a more detailed circuit diagram of a two-stage implementation of the multiple power mode amplifier.

FIG. 8 shows a more detailed circuit diagram of a specific implementation of the multiple power mode amplifier of FIG. 5. A specific circuit implementation for the first impedance matching circuit 130 of FIG. 5 is shown within the box 130 of FIG. 8. A specific circuit implementation for the second impedance matching circuit 140 of FIG. 5 is shown within the box 140 of FIG. 8. A specific circuit implementation for the third impedance matching circuit 150 of FIG. 5 is shown within the box 150 of FIG. 8. A specific circuit implementation for the fourth impedance matching circuit 160 of FIG. 5 is shown within the box 160 of FIG. 8. A specific circuit implementation for the impedance transformer circuit 170 of FIG. 5 is shown within the box 170 of FIG. 8. A specific circuit implementation for the driver circuit 100 of FIG. 5 is shown within the box 100 of FIG. 8. A specific circuit implementation for the power stage circuit 120 of FIG. 5 is shown within the box 120 of FIG. 8. A specific circuit implementation for the applied voltage control circuit 90 of FIG. 5 is shown within the box 90 of FIG. 8.

FIG. 8 also shows an input matching circuit 80, not shown in FIG. 5, which is used to provide impedance at the input to prevent or minimize reflected waves. This is merely an example of an input matching circuit and there are many other circuit configurations that may be used.

An input signal is connected to the power mode amplifier at node 70 to the input matching circuit 80. Within input matching circuit 80, an inductor 9003 is connected between 70 and a node 9006, a capacitor 9009 is coupled between node 9011, and a capacitor 9013 is connected between node 9006 and a reference voltage line, ground.

The implementation of FIG. 8 uses bipolar junction transistors (BJTs). However, in other embodiments, the invention may use heterostructure bipolar transistors, heterojunction bipolar transistors, MOS transistors, field effect transistors (FETs), MESFETs, JFETs, BiCMOS, triodes, complementary metal-oxide semiconductor (CMOS) transistor technology, metal-oxide semiconductor transistors, p-type metal-oxide semiconductor transistors, n-type metal-oxide semiconductor transistors, high electron mobility transistors, or metal semiconductor field effect transistors, and their analogous devices, and other types of active devices, in any combination. These devices may be fabricated using semiconductor technology including silicon, gallium arsenide, silicon over insulator, or silicon germanium. One or more devices may also be fabricated using nanotechnology. Furthermore, the particular type of BJT shown is an npn-type device. However, it is understood that with the necessary changes, the circuitry may also use pnp-type device types. As a further example, NMOS (or n-channel MOSFET) or PMOS (or p-channel MOSFET) devices may be used. CMOS process technology allows the manufacture of NMOS and PMOS device types for a single integrated circuit.

Driver 100 includes a BJT transistor Q5, which may be referred to as a driver transistor, having its base connected to 9011 and its emitter coupled to the reference voltage (ground in a specific embodiment). A collector of Q5 is connected to node 9015, which is an output of the driver and input to first impedance matching unit 130. The circuitry shown for the driver is merely an example of a driver circuit that may be used, and other amplifier designs may be used. Driver 100 is a common-emitter-type amplifier circuit. Other types of amplifier circuit configurations that may be used include common base, cascade, and cascode. These amplifier circuits may require different bias circuits and voltages or currents that shown or described in FIG. 8, and appropriate changes to the circuitry may be made.

DC power is provided to Q5 via two voltage sources, a voltage1 and a voltage2. Voltage2 is provided to node 9011 through a transistor 9017 and resistance or impedance 9019. A capacitor or capacitance 9021 is connected between voltage2 and the reference voltage. A base electrode of transistor 9017 is connected to a node 9023. A resistor 9025 is connected between voltage1 and node 9023. Two diodes are connected between node 9023 and the reference voltage. Although two diodes are shown, any number of diodes (for a voltage drop) may be used to provide a bias voltage. More diodes will generally provide a greater voltage drop.

In a specific embodiment, voltage1 is about 2.85 volts. Voltage1 may be a relatively constant voltage provided to the multiple power mode amplifier circuit from a source such as a voltage regulator. As discussed previously, one particular application of the circuitry is for battery-operated devices such as a mobile or cellular phone where power will be supplied by a battery. In such an application, the specific levels of one or more voltage sources may vary depending on battery conditions. When freshly charged, a battery typically provides a higher voltage level output and depending on the specific battery technology or chemistry (e.g., nickel metal hydride, nickel cadmium, lithium ion, and lead acid), this voltage level gradually drops as the battery is drained. In a specific embodiment, voltage2 is a voltage source having a level depending on the battery state. For example, when the battery is fully charged, voltage2 may be 4.2 volts, and when the battery is almost empty or completely drained, voltage2 may be about 3.2 volts. The amplifier circuitry in FIG. 8 should operate properly under all voltage conditions of the battery. Typically, the worst case operating conditions are given when at the lowest voltage level seen during normal operation, which occurs when the battery is almost empty.

First impedance matching unit 130 is connected between node 9015 and node 72. In the implementation in FIG. 8, the first impedance matching unit includes a transmission line 9028 connected between node 9015 and voltage2, a capacitor 9030 connected between voltage2 and the reference voltage, and a capacitor 9032 connected between node 9015 and node 72.

The transmission line may simply be a line or wire that can be modeled as a ladder network of series inductors and shunt capacitors. Characteristics of the transmission line depend on length and width of the line or wire, and these are design parameters. In an embodiment, a transmission line is a line having an electrical line length 1/10 or greater of a guided wavelength within a medium. The wavelength typically changes depending on the specific medium. For example, a wavelength will be different if the medium is air versus a semiconductor. For a semiconductor medium and a 2 gigahertz signal, a transmission line may have a line length of about 10 microns or more. A width of this line may be about 5 microns or more.

In another embodiment, a transmission line is a line having an electrical line length 1/20 or greater of a guided wavelength in a medium. In another embodiment, a transmission line is a line having an electrical line length 1/30 or greater of a guided wavelength in a medium. In another embodiment, a transmission line is a line having an electrical line length 1/50 or greater of a guided wavelength in a medium. In another embodiment, a transmission line is a line having an electrical line length 1/50 or greater of a guided wavelength in a medium. In another embodiment, a transmission line is a line having an electrical line length 1/100 or greater of a guided wavelength in a medium.

Second impedance matching unit 140 is connected between node 72 and a node 74. In the implementation in FIG. 8, the second impedance matching unit includes an inductor 9037 connected between node 72 and the reference voltage, and a capacitor 9039 connected between node 72 and 74. An inductor in this circuit or any of the circuits of the invention may be implemented using any technique to provide an inductance device. Some examples of inductance devices or implementations of inductors include wire bonding, transmission line, microstrip line, strip line, coaxial cable, or coplanar waveguide. Any of these or combinations of these may be used to implement inductances in the invention, such as those indicated by the inductor symbol in the circuit diagrams.

Impedance transformer circuit 170 is connected between node 72 and a node 76. In the implementation in FIG. 8, the impedance transformer circuit includes a capacitor 9042 connected between node 72 and a node 9042, a capacitor 9046 connected between node 9044 and the reference voltage, and an inductor 9048 is connected between node 9044 and node 76.

Power stage 120 is connected between node 74 and node 9116. Power stage is an amplifier circuit including a BJT transistor Q6 having its base connected to node 74, a collector connected to node 9116, and an emitter connected to the reference voltage. Power stage 120, like driver 100, is a common-emitter-type amplifier circuit. Other types of amplifier circuit configurations that may be used include common base, cascade, and cascode. These amplifier circuits may require different bias circuits and voltages or currents that shown or described in FIG. 8, and appropriate changes to the circuitry may be made. Also, power stage 120 may be a different type of amplifier circuit from driver 100.

The power stage may be turned on or off depending on a voltage at the voltage control node 9051. FIG. 8 shows a specific implementation of the applied voltage control circuit 90. Other circuits may be used that perform a similar function. The amplifier circuit will be in a low power mode when the voltage control node is at a first level (e.g., about a level of voltage1 or 2.85 volts). The circuit will be in a high power mode when the voltage control node is at a second level (e.g., about a level of the reference voltage or ground or 0 volts). When in the low power mode, transistor Q6 will be in a high impedance mode and draw little current. When in the high power mode, transistor Q6 will be operating and draw current to amplify its input signal. In an embodiment, in the high power mode, the power stage will provide from about 5 to 15 decibels (dB) of gain. However, the exact is dependent on the transistor or device technology used and also on how the amplifier circuit is biased. Examples of other embodiments of the multiple mode amplifier implemented using other technologies such as CMOS and MESFET are discussed below.

In operation, depending on the voltage level at node 9051, current from voltage1 goes through node 9103 and will pass either (a) through a transistor 9105 to the reference voltage line or (b) through a transistor 9108 to node 74, the base of transistor Q6. When in the low power mode, node 9051 will be 2.85 volts, relatively little current passes through transistor 9108, compared to the path through transistor 9105, and the base of Q6 will be at about the reference voltage or 0 volts so the power stage will be essentially off. When in the high power mode, node 9051 will be at the reference voltage or 0 volts, relatively little current passes through transistor 9105, compared to the path through transistor 9108, and the base of Q6 will be at about 1.0 volt and 1.4 volts so the power stage will be operating or on.

Third impedance matching unit 150 is connected between node 9116 and 76. In the implementation in FIG. 8, the third impedance matching unit includes a transmission line 9072 connected between node 76 and voltage2 and a capacitor 9074 connected between voltage2 and the reference level. In a specific implementation, capacitor 9074 is relatively large such as about 100 picofarads. This capacitor provides an RF or virtual ground at voltage2 and also stabilizes voltage 2. A capacitor 9119 is between node 9116 and the reference level. An inductor 9122 is connected between nodes 9116 and 76.

Inductor 9122 may be formed on the same integrated circuit as one or more other components in the MMIC box of FIG. 8. In a specific embodiment, inductor 9122 is formed using a wire bond line between node 9116 and components at node 76. Furthermore, inductor 9122 may be formed using a passive component such as an inductor coil.

In an embodiment, components shown within the MMIC box are on-chip, which means they are included on a single integrated circuit such as the same semiconductor die or semiconductor body. By including as many components as possible on a single integrated circuit, this reduces costs and reduces the amount of space required by the amplifier. This is especially important for portable electronics where consumers desire more compact form factors. In other embodiments, one or more of the components shown within in the MMIC box may be off-chip by using discrete components or on different integrated circuits. For example, as discussed above, inductor 9122 may be off-chip. In another embodiment, input matching circuit 80 is off-chip.

Fourth impedance matching unit 160 is connected between node 76 and an output signal node 240. In the implementation in FIG. 8, the fourth impedance matching unit includes a transmission line 9082 connected between node 76 and a node 9084, a capacitor 9086 connected between node 76 and the reference level, a capacitor 9088 connected between node 9084 and the reference level, and a capacitor 9090 connected between node 9084 and output signal 240. In an embodiment, capacitor 9086 is an optional capacitor and may be omitted in some embodiments of the invention. Furthermore, in some embodiments, this capacitor may be implemented using parasitic capacitance. Some examples of parasitic capacitance include capacitance of a line or other conductor (e.g., long line length), capacitance of a transistor gate, and capacitance at a node due to a number of devices or size of devices or components attached to that node.

Figure 9:
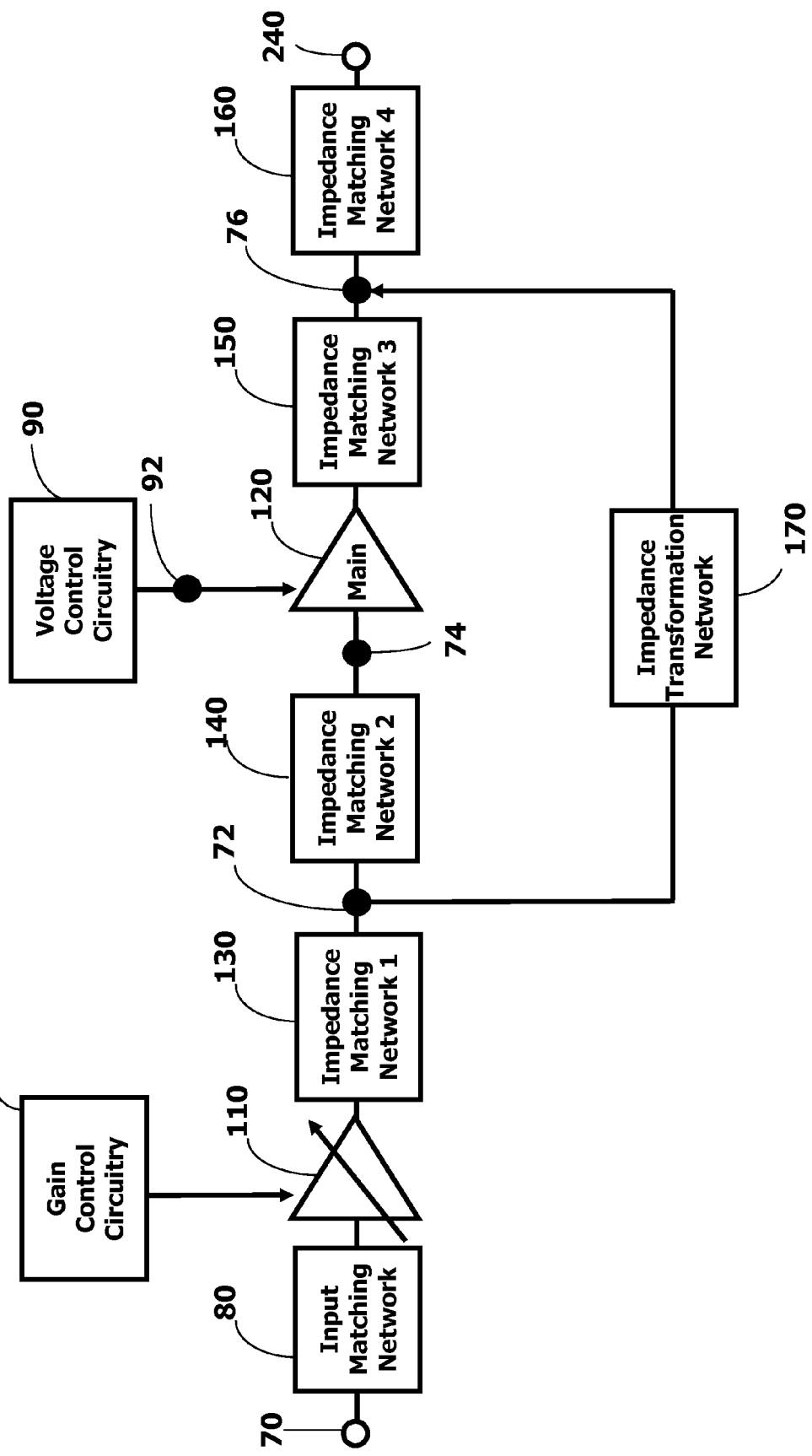
FIG. 9 shows an alternative embodiment of a multiple power mode amplifier where driver 110 is a variable gain amplifier (VGA) or predistorter circuit.

FIG. 9 shows an alternative embodiment of the invention where driver 110 is a variable gain amplifier (VGA). A gain control circuit 91 generates a signal to control a gain of the driver. The circuitry in FIG. 9 operates similarly and provides the same benefits of the circuitry in FIG. 5. However, the implementation in FIG. 9 has the additional feature where the gain can be varied by using driver 110.

This circuit configuration may be used when a particular application requires variable gain. This circuit may also be used in a fixed-gain application, in which case a gain of driver 110 is fixed. This allows the same circuitry to be used in multiple applications, without the need to having different parts. Furthermore, wireless telephone standards vary and different gains may be required for different systems, so the variable gain version of the invention can be used to address the different system specifications, without requiring a separate part for each standard. For example, an amplifier of the invention may be programmed electrically, by fuses, laser cutting, programmable cells, or other techniques after fabrication.

Alternatively, in a fixed-gain application, driver 110 may work as a predistorter circuit. A predistorter circuit provides overemphasis to compensate for gain roll off of the main stage amplifier. Generally as power goes up, gain of an amplifier rolls off. To compensate for this gain roll off in main stage 120, driver or predistorter circuit 110 increases its gain as power goes up, so the total gain of the circuitry (amplifiers 110 and 120) will be more constant, increasing the linearity of the amplifier, especially in the high power region. Therefore, when using a predistorter 110, the circuitry will provide a fixed gain for a wider power range.

FIG. 9 provides a basic two-amplifier implementation of the invention. The first stage can be either fixed gain or variable gain amplifier stage. In the latter case, it can be used as a predistorter. The basic concept is to bypass one or more stages in the multiple stage amplifiers to reduce the DC current consumption. For example, for N-stage amplifiers, Nth, (N−1)th, and so forth second stages can be bypassed using bypass switching circuits without any switches. It is preferable to bypass later stages (Nth for example) since they consume more DC current. Voltage control circuitry 90 turns off the main stage when in the low power mode. Impedance transformation network 170 works as a bypass circuit. The core idea is that this circuit does not include any costly switches but still functions as a bypass switching circuit, which is made possible by optimizing impedance matching networks 1, 2, 3, and 4.

In a specific implementation, the invention is an integrated circuit having a first circuit branch, connected between a first node and a second node, where the first circuit branch has N amplifier stages in series, where N is an integer 0 or greater. There is a second circuit branch, connected between the second node and a third node, where the second circuit branch has M amplifier stages in series, where M is an integer 1 or greater. There is a third circuit branch, connected between the second node and the third node, where the third circuit branch has an impedance transformer unit. During a first mode of operation of the circuit, at least one amplifier stage of the M amplifier stages of the second branch is in an off state, consuming less power than in an on state, and a signal output from the N amplifier stages of the first branch passes substantially through the third circuit branch. During a second mode of operation of the circuit, the M amplifier stages of the second circuit branch are in the on state and a signal output from N amplifier stages of the first branch passes substantially through the second circuit branch. In operation, when N is 0 and M is 1 or greater, the bypassing circuit may bypass all the amplifier stages of the amplifier, meaning there is either amplification or no amplification.

Figure 10:
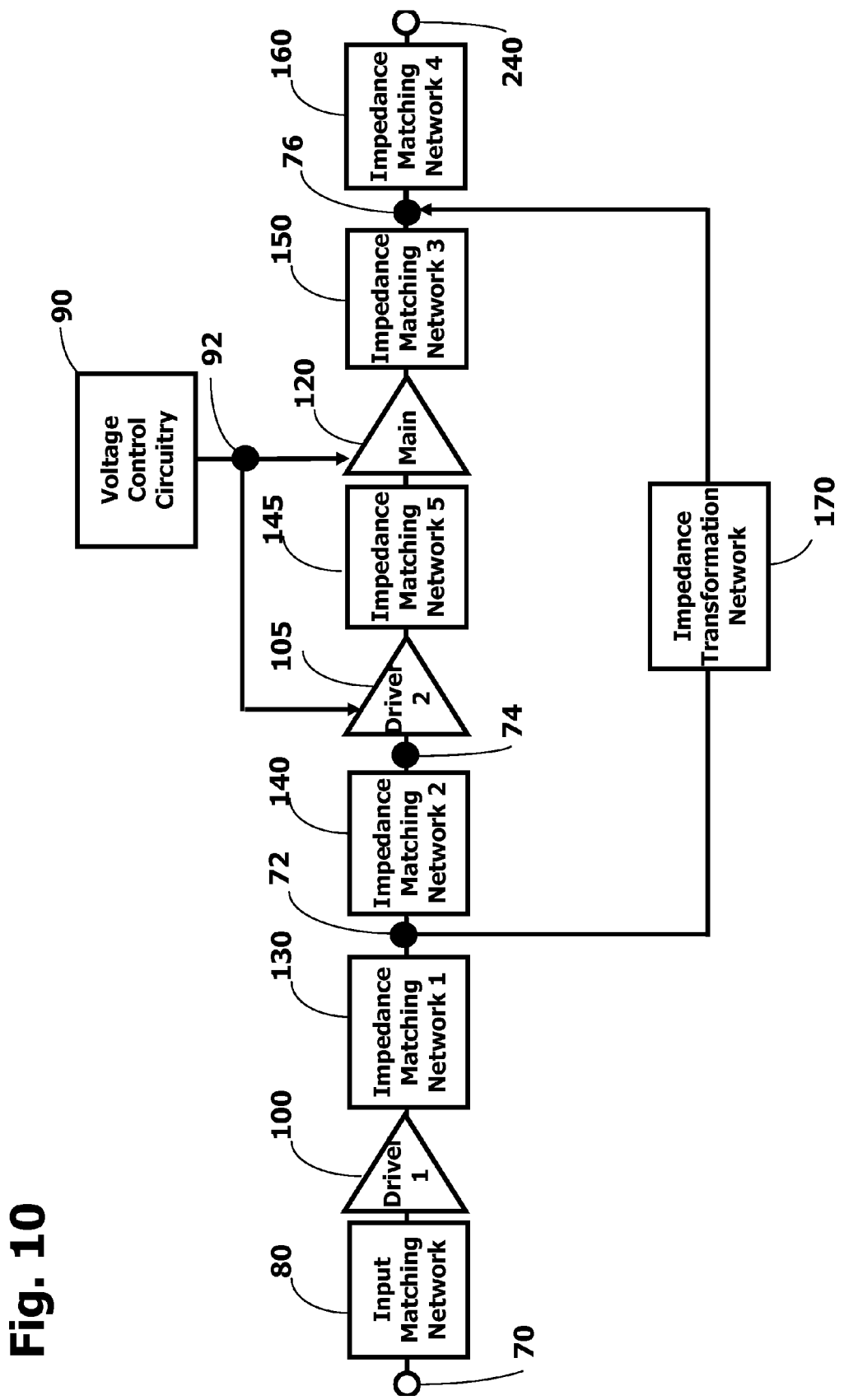
FIG. 10 shows another alternative embodiment of a multiple power mode amplifier having three stages, two drivers and one power stage.

FIG. 10 shows another alternative embodiment of the invention having two drivers and one power stage. Compared to the FIG. 5 implementation, this amplifier circuit further includes a driver2 105, controlled by the voltage control circuit 90, and an impedance matching network 5 145, which are in between the impedance matching network 2 circuit 140 and main power stage 120. Driver1 100 may have a fixed gain or may have a variable gain (or may be a predistorter), such as driver 110 in FIG. 9. Note that for this configuration at a bypass node, node 72, there is an impedance matching network for each branch (i.e., impedance matching network 1 130, impedance matching network 2 140, and impedance transformation network 170).

Figure 11:
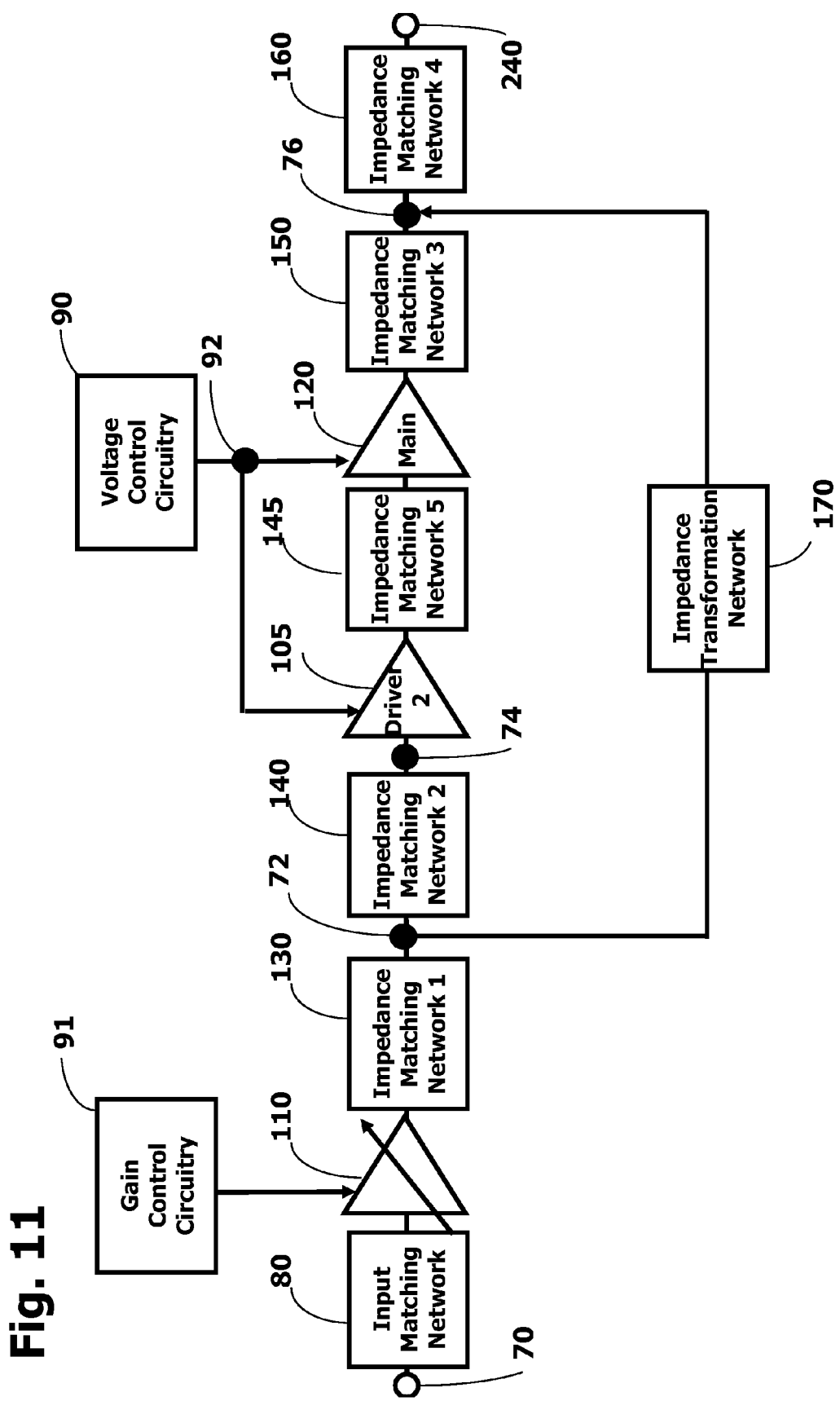
FIG. 11 shows an alternative embodiment of a three-stage multiple power mode amplifier where one of the drivers is a variable gain amplifier or predistorter circuit.

FIG. 11 shows a configuration where driver1 110 is a variable gain amplifier, controlled by gain control circuitry 91. Besides this difference, the circuitry operates similarly as that in FIG. 10. During the operation of this three-stage amplifier configuration, both third (last and main) and second stages may be bypassed so that only the first stage is turned on all the time. In this case, voltage control circuitry turns off the second and third stages when in the low power mode.

The FIG. 10 circuit has a maximum of three gain stages, while the circuit in FIG. 5 has a maximum of two gain stages. The bypass path with impedance transformation network 170 bypasses both driver2 and the main power stage. When in the low power mode, both driver2 and main power stage will be off and draw minimal current. When in the high power mode, both driver2 and main power stage will be on and provide gain.

Because there are more gain stages, typically the circuit in FIG. 10 has more gain than the circuit in FIG. 5. Further, because there are more individual stages in FIG. 10, there are more degrees of freedom in the design, which makes its design and utilization more flexible. This may make designing a multiple mode amplifier with certain technologies such as gallium arsenide versus silicon. Gallium arsenide technology amplifiers typically provide greater gain, so typically fewer amplification stages are needed to obtain the same gain as with a technology such as silicon.

Figure 12:
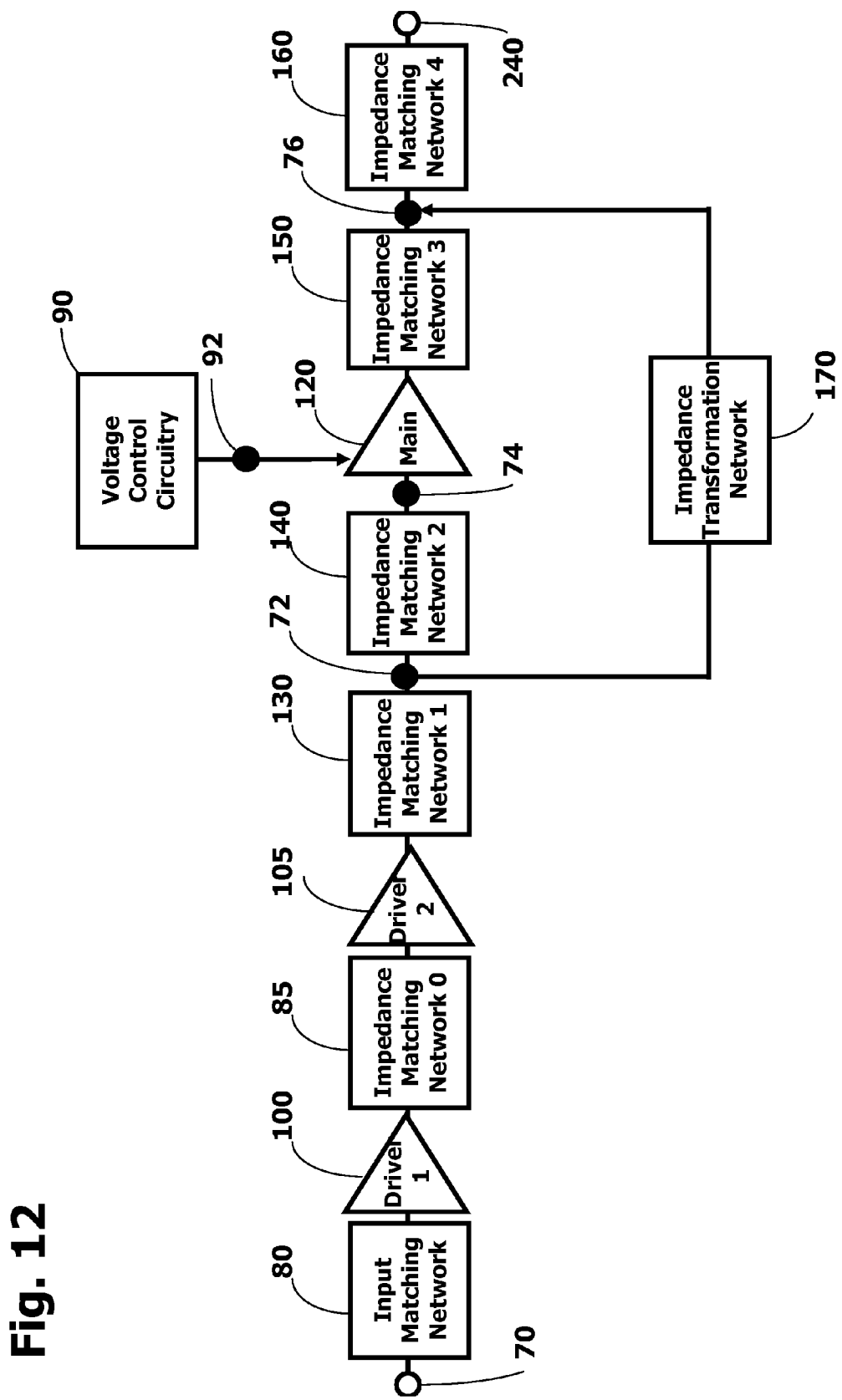
FIG. 12 shows another alternative embodiment of a three-stage multiple power mode amplifier, but the bypass path with impedance transformation network bypasses only the main power stage.

FIG. 12 shows another embodiment of an amplifier circuit. This embodiment is similar to FIG. 10 there are three amplifiers stages to boost the gain. But the bypass path with impedance transformation network bypasses only the main power stage, not the driver2 stage as in FIG. 10.

This circuit provides less power savings than the one in FIG. 10 because only the main power stage will be bypassed instead of both driver2 and main power stages.

Figure 13:
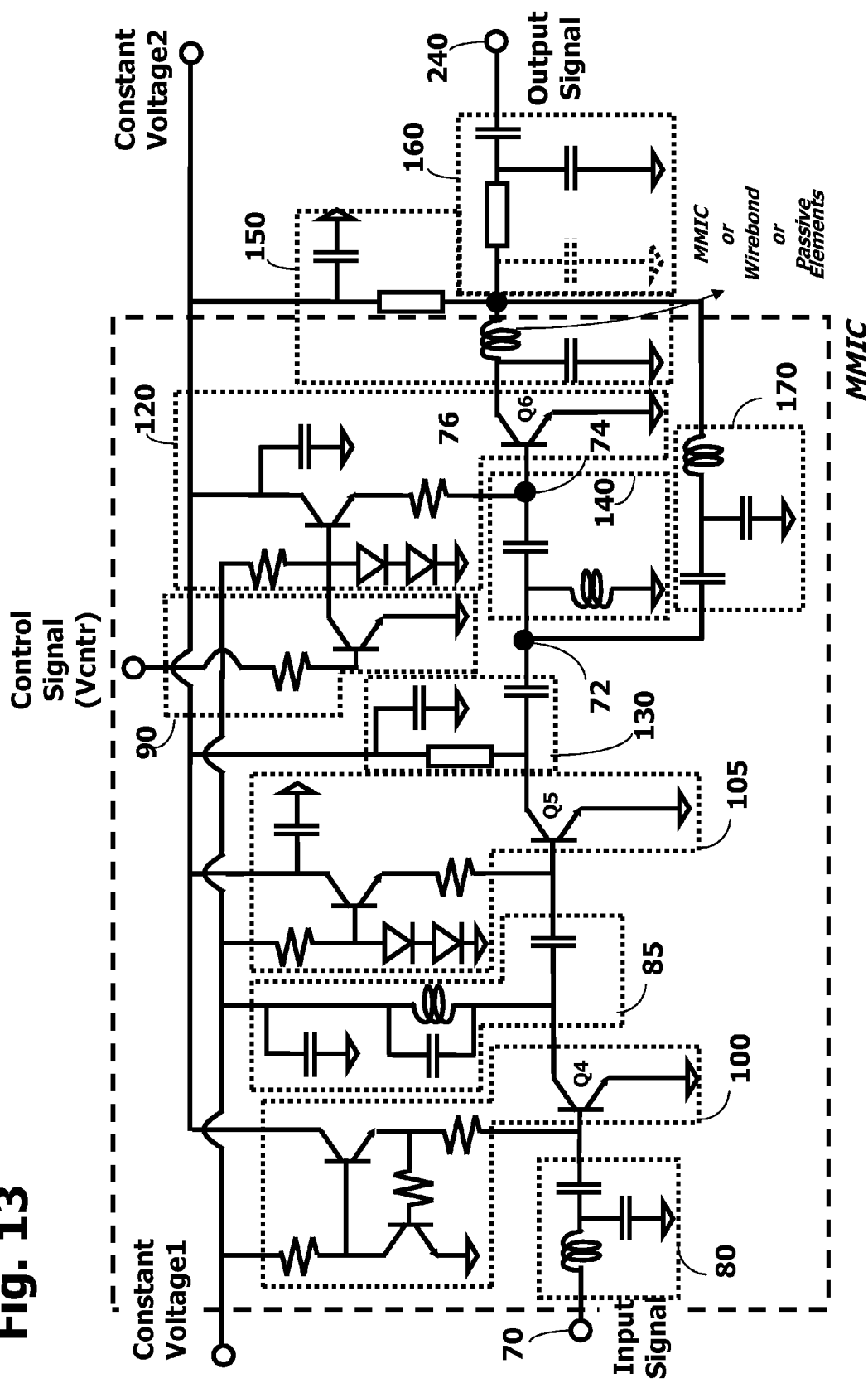
FIG. 13 shows a more detailed circuit diagram of the amplifier circuit in FIG. 12.

FIG. 13 shows a more detailed circuit diagram of the amplifier circuit in FIG. 12. Details of each of the block of FIG. 12 are shown in boxes indicated by similar reference numbers. The details are similar as discussed above for FIG. 8, except for blocks 85 and 105. In this embodiment, the amplifier circuit in driver2 105 is similar to the amplifier circuit in main driver 120 but the sizes of the transistors may be smaller. However, as discussed above, other amplifier circuit designs and configurations may be used, and in any combination for the multiple mode amplifier.

Figure 14:
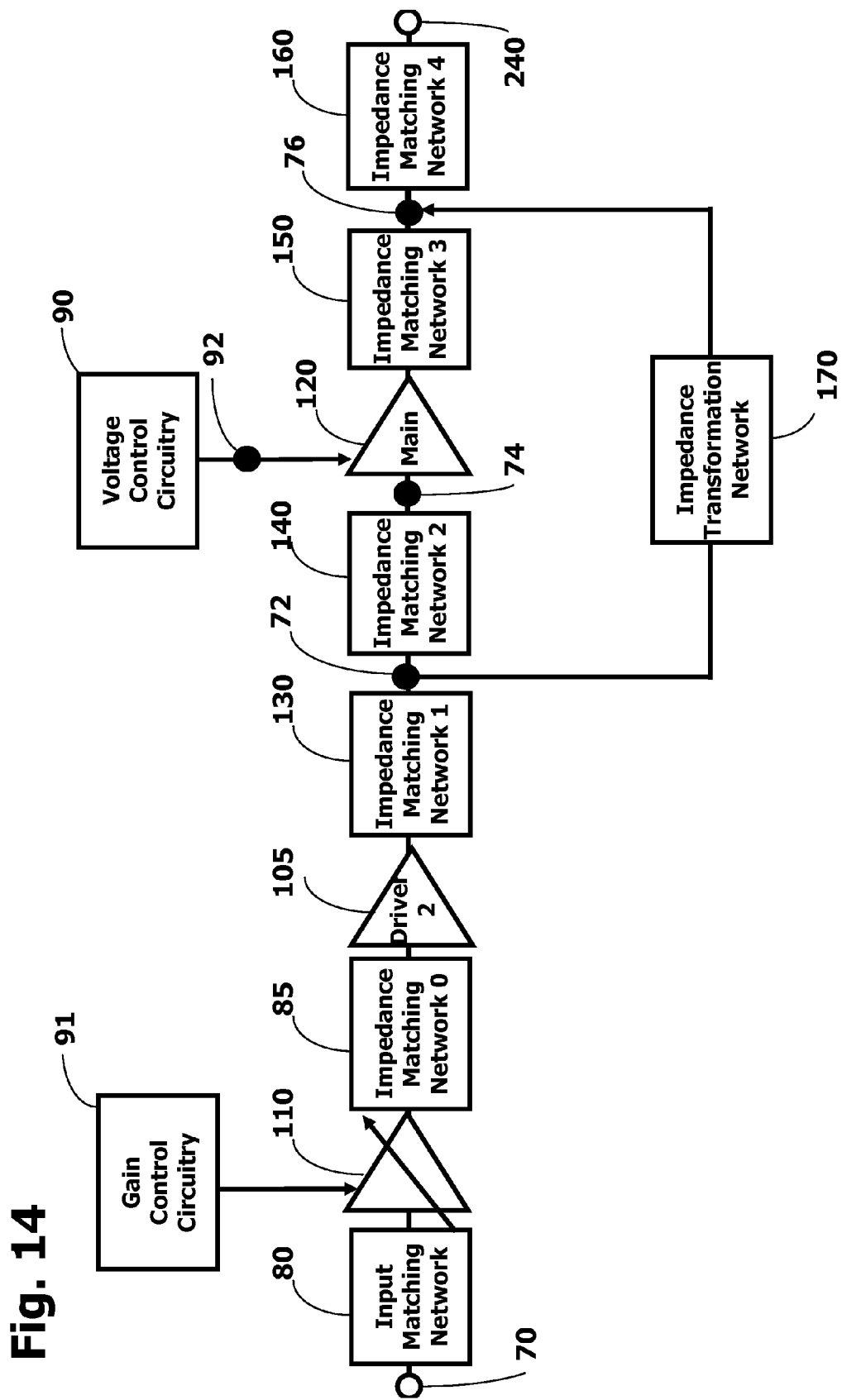
FIG. 14 shows an alternative embodiment of the amplifier circuit in FIG. 12 where one of the drivers is a variable gain amplifier or predistorter.

FIG. 14 shows a similar amplifier circuit as FIG. 12, but driver 110 is a variable gain amplifier or predistorter to provide the benefits as discussed above. FIG. 14 is based on the similar to the concept as described in FIG. 9, but the concept has been extended to three stages in FIG. 14.

Figure 15:
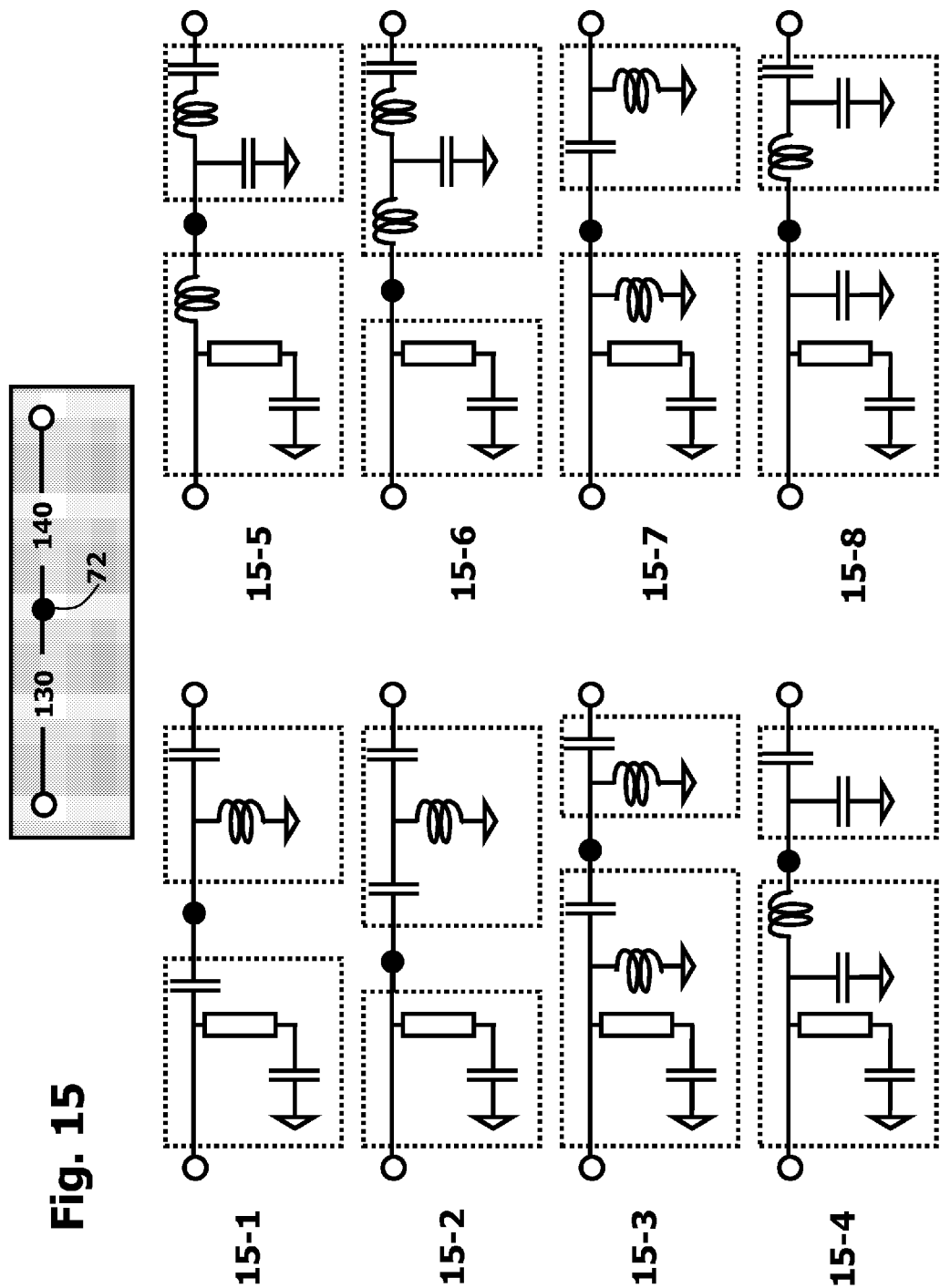
FIG. 15 shows various different circuit arrangements for impedance matching network 1 and impedance matching network 2.

FIG. 15 shows various different circuit arrangements for impedance matching network 1 block 130 and impedance matching network 2 block 140. Any of these circuits may be substituted in corresponding block in the multiple mode amplifier circuits previously described including FIGS. 5 and 8 to 14.

For example, for configuration 15-1, block 130 of the multiple mode amplifier circuit may be replaced by what is shown within box 1605, and block 140 may be replaced by what is shown within box 1607. This combination of circuitry in 1605 and 1607 would provide the impedance matching networks 1 and 2 functionality, as discussed above. Other combinations of circuits are shown in configurations 15-2 to 15-8. Any of these alternative embodiments of circuits may be used to form a multimode amplifier circuit of the present invention. FIG. 15 shows examples of the possible circuit combinations and is not meant to be exhaustive. Other combinations are possible.

Figure 16:
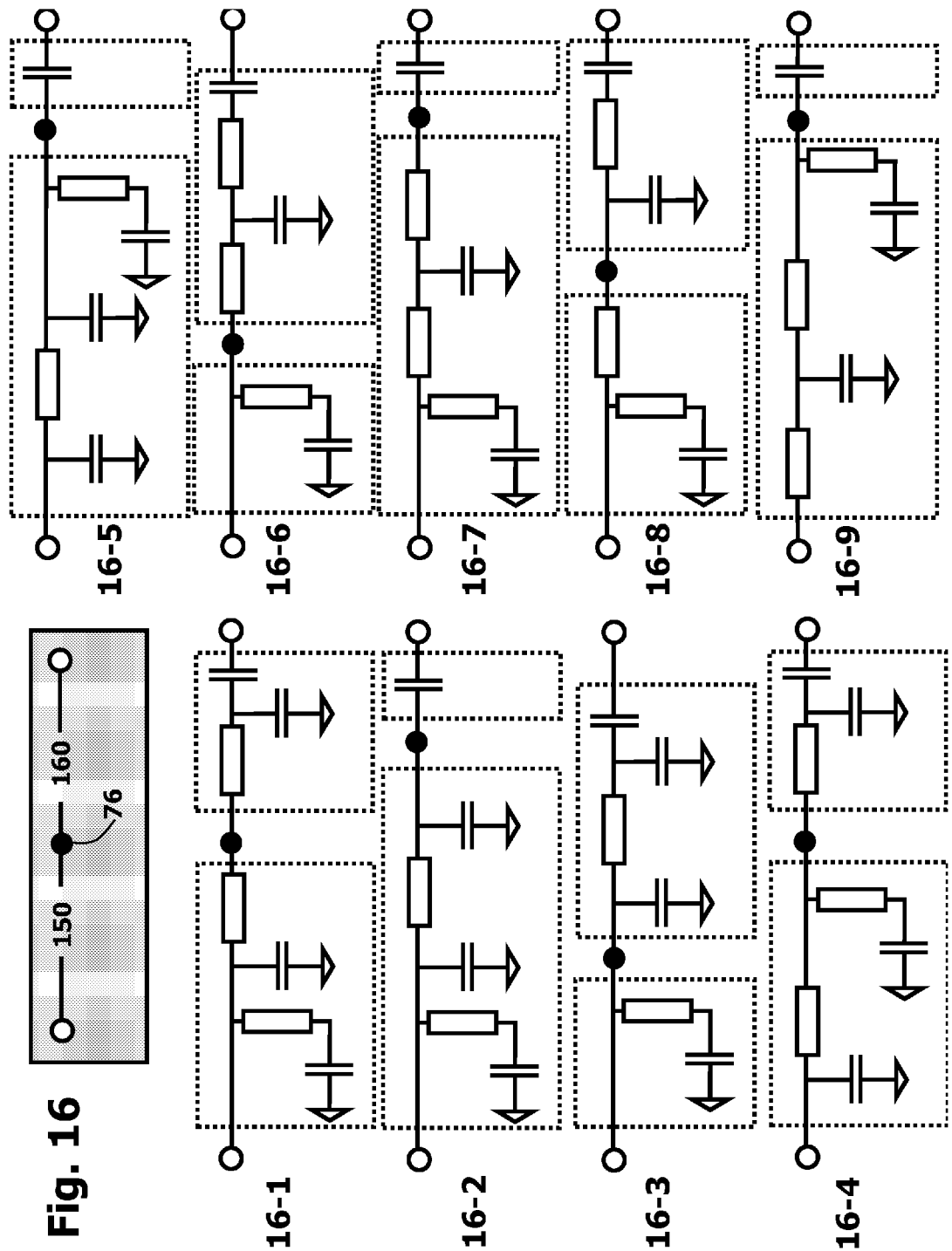
FIG. 16 shows various different circuit arrangements for impedance matching network 3 and impedance matching network 4.

FIG. 16 shows various different circuit arrangements for impedance matching network 3 block 150 and impedance matching network 4 block 160. Any of these circuits may be substituted in corresponding block in the amplifier circuits in FIGS. 5, and 8 to 14.

For example, for configuration 16-1, block 150 of the multiple mode amplifier circuit may be replaced by what is shown within box 1705, and block 160 may be replaced by what is shown within box 1707. This combination of circuitry in 1705 and 1707 would provide the impedance matching networks 3 and 4 functionality, as discussed above. Other combinations of circuits are shown in configurations 16-2 to 16-9. Any of these alternative embodiments of circuits may be used to form a multimode amplifier circuit of the present invention. FIG. 16 merely shows examples of the possible circuit combinations and is not meant to be exhaustive. Other combinations are possible.

Figure 17:
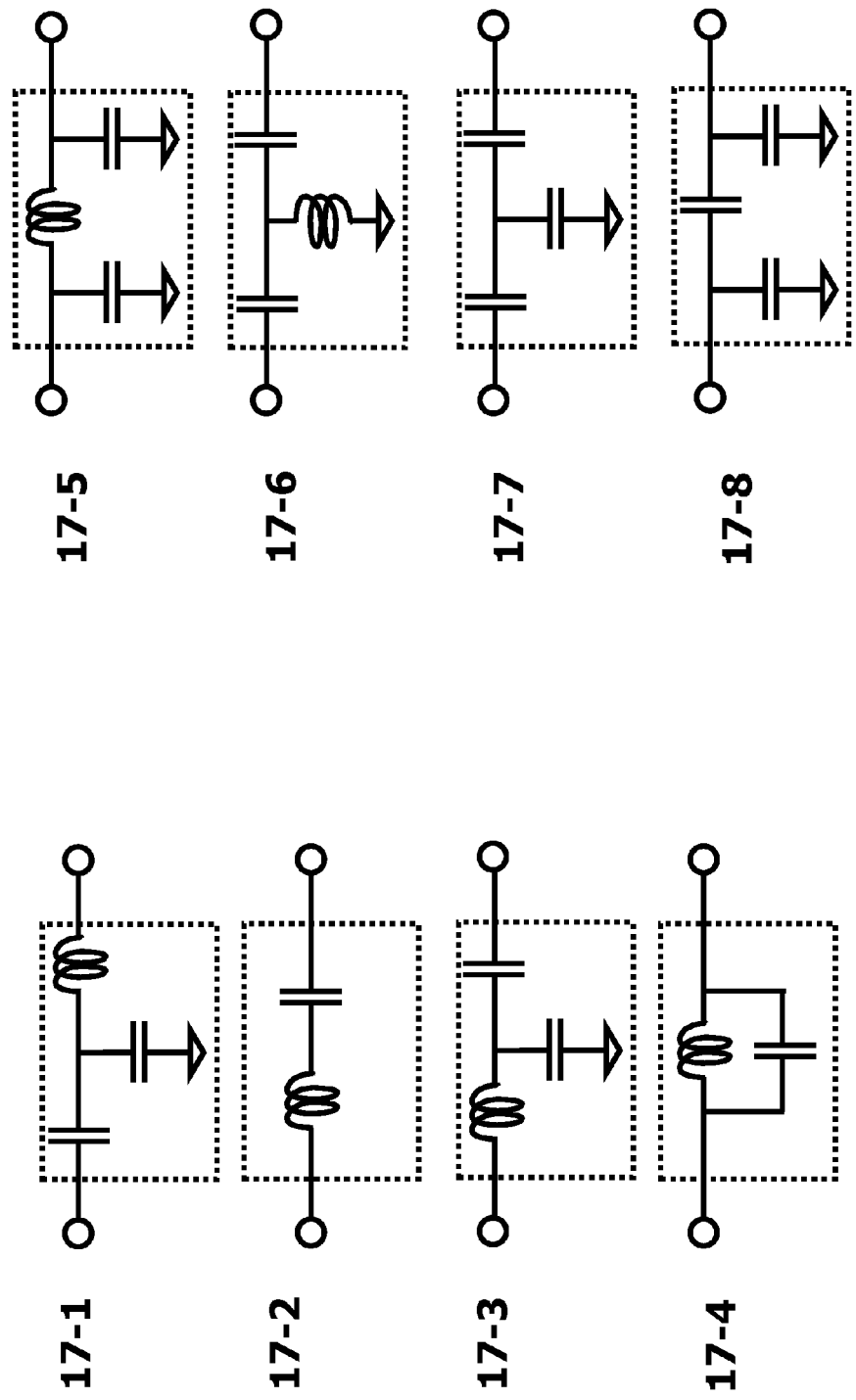
FIG. 17 shows various different circuit arrangements for the impedance transformation network.

FIG. 17 shows various different circuit arrangements for impedance transformation network block 170. Any of these circuits may be substituted in corresponding block in the amplifier circuits in FIGS. 5, and 8 to 14.

For example, for configuration 17-1, block 170 of the multiple mode amplifier circuit may be replaced by what is shown within box 1805. The circuitry in 1805 would provide the impedance transformation network functionality, as discussed above. Other circuits are shown in configurations 17-2 to 17-8. Any of these alternative embodiments of circuits may be used to form a multimode amplifier circuit of the present invention. FIG. 17 merely shows examples of the possible circuits and is not meant to be exhaustive. Other circuits are possible.

Figure 18:
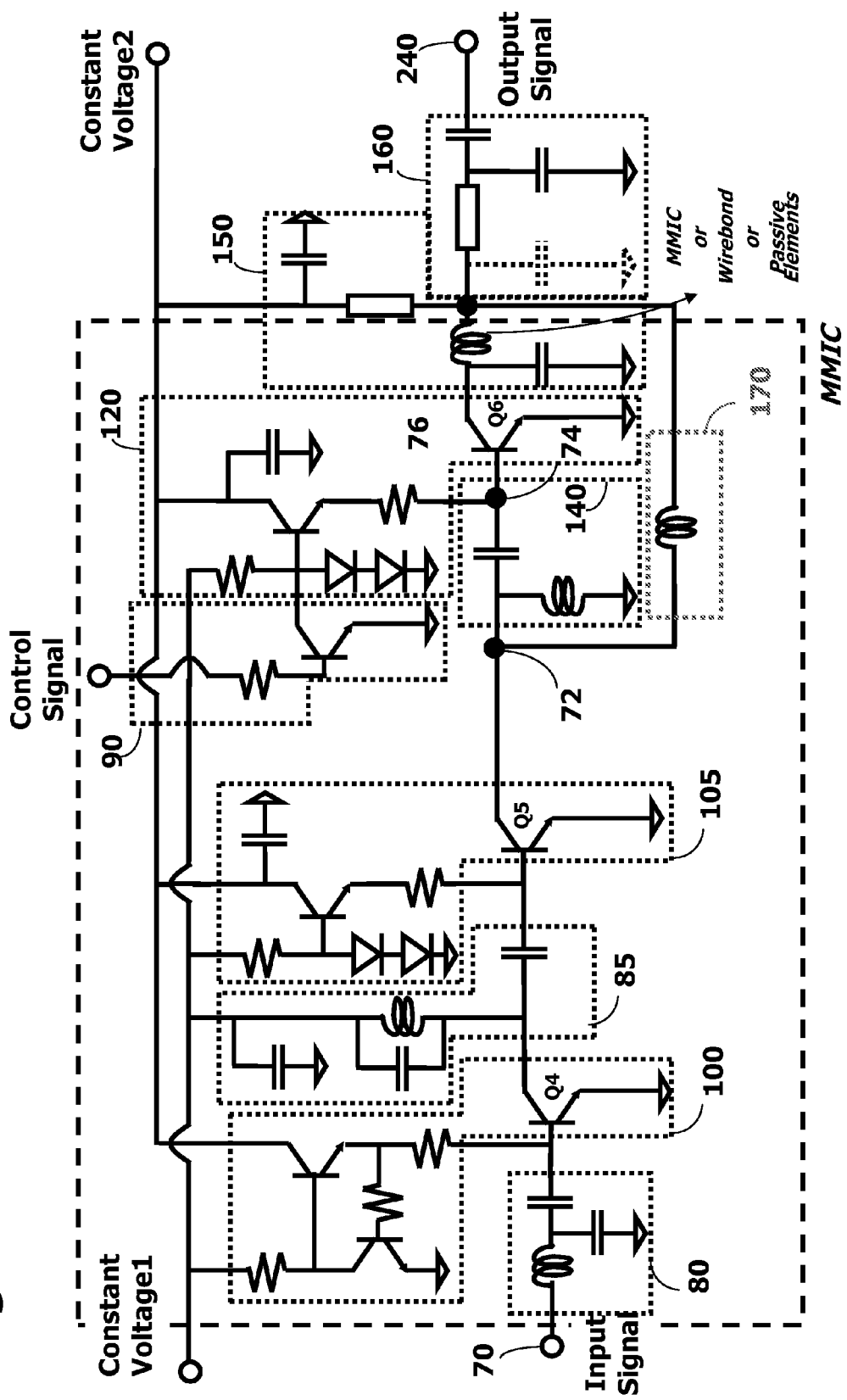
FIG. 18 shows a more detailed circuit diagram of an implementation of the amplifier circuit of FIG. 14.

FIG. 18 shows a more detailed circuit diagram of FIG. 14. However, in the circuitry of FIG. 18, first impedance matching circuit 130 is omitted. Therefore, the impedance transformation network 170 is connected directly to driver stage amplifier Q5 at node 72. Also, impedance transformation network 170 is realized using a single inductor. The net effect is thus a reduction in component count, resulting in a reduced cost of the amplifier module.

For implementing a amplifier according to the invention, as the FIG. 18 example shows, there is no need to use all the impedance matching networks, 130, 140, 150, and 160, to realize the concepts of the invention. By optimizing the other impedance matching networks 140, 150, 160, and impedance transformation network 170, one or more of the impedance matching networks can be eliminated. For example, in an implementation, impedance matching network 2 140 may be omitted. In another implementation, impedance matching network 3 150 may be omitted. In another implementation, impedance matching network 4 160 may be omitted. And in further embodiments, any combination of these impedance matching networks may be omitted.

FIG. 19 shows various different circuit arrangements for the voltage control circuitry 90. Any of these circuits may be substituted in corresponding block in the amplifier circuits in FIGS. 5, and 8 to 14.

For example, for configuration 19-1, block 90 of the multiple mode amplifier circuit may be replaced by what is shown within box 1905. The circuitry in 1905 would provide the voltage control circuitry functionality, as discussed above. Other circuits are shown in configurations 19-2 to 19-4. Any of these alternative embodiments of circuits may be used to form a multimode amplifier circuit of the present invention. FIG. 19 merely shows examples of the possible circuits and is not meant to be exhaustive. Other circuits are possible.

Figure 20:
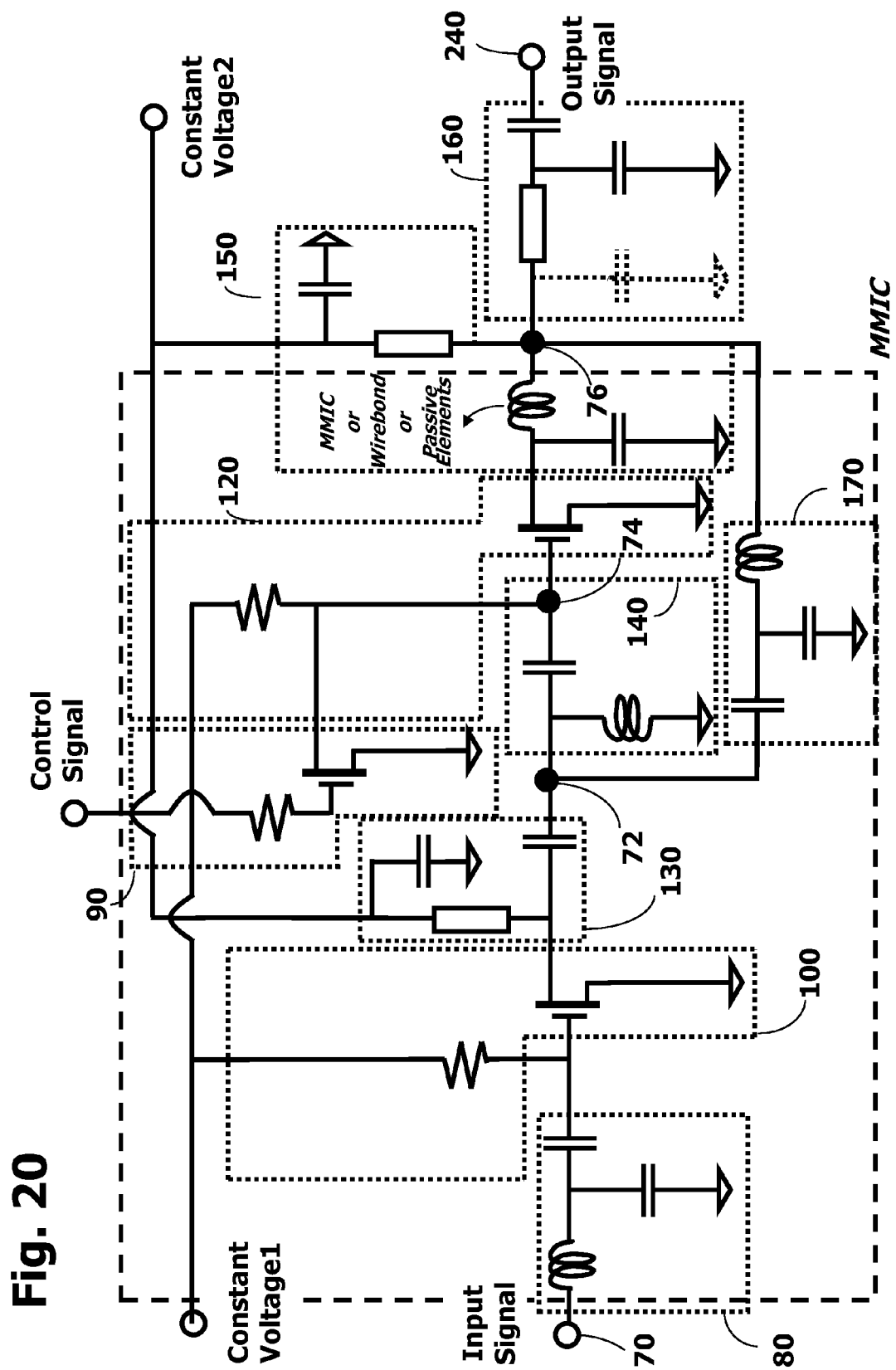
FIG. 20 shows a two-stage multiple mode amplifier circuit of the invention implemented using CMOS technology.

FIG. 20 shows a multiple mode amplifier circuit of the invention implemented using CMOS technology. This is a two-stage implementation such as shown in FIG. 5. This figure shows merely an example of an embodiment of the invention, and other embodiments are possible. For example, any of the alternative circuit configurations for the circuitry shown in FIGS. 15 to 17 and 19 may be substituted for the blocks in FIG. 20.

Figure 21:
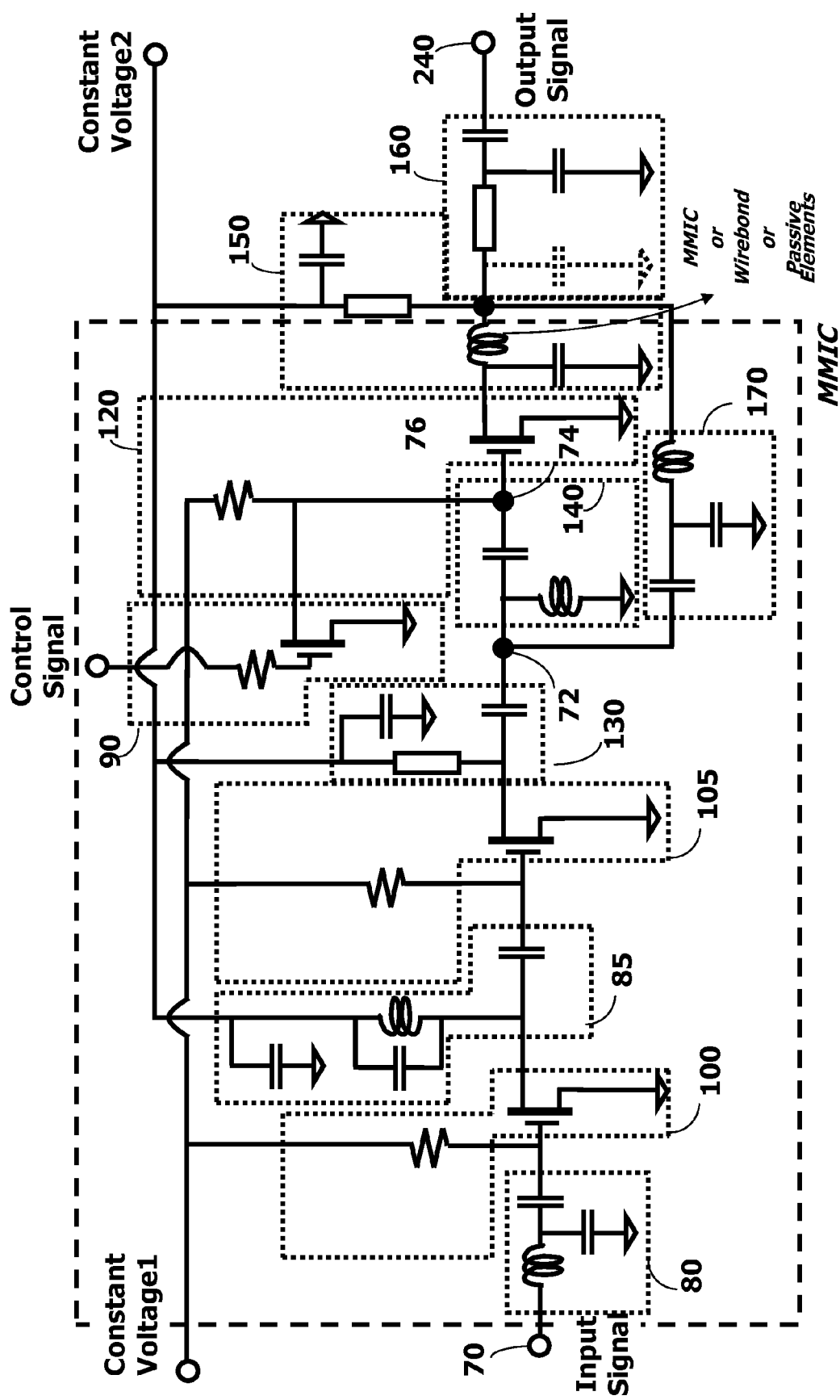
FIG. 21 shows a three-stage multiple mode amplifier circuit of the invention implemented using CMOS technology.

FIG. 21 shows a multiple mode amplifier circuit of the invention implemented using CMOS technology. This is a three-stage implementation such as shown in FIG. 12. This figure shows merely an example of an embodiment of the invention, and other embodiments are possible. For example, any of the alternative circuit configurations for the circuitry shown in FIGS. 15 to 17 and 19 may be substituted for the blocks in FIG. 21.

Figure 22:
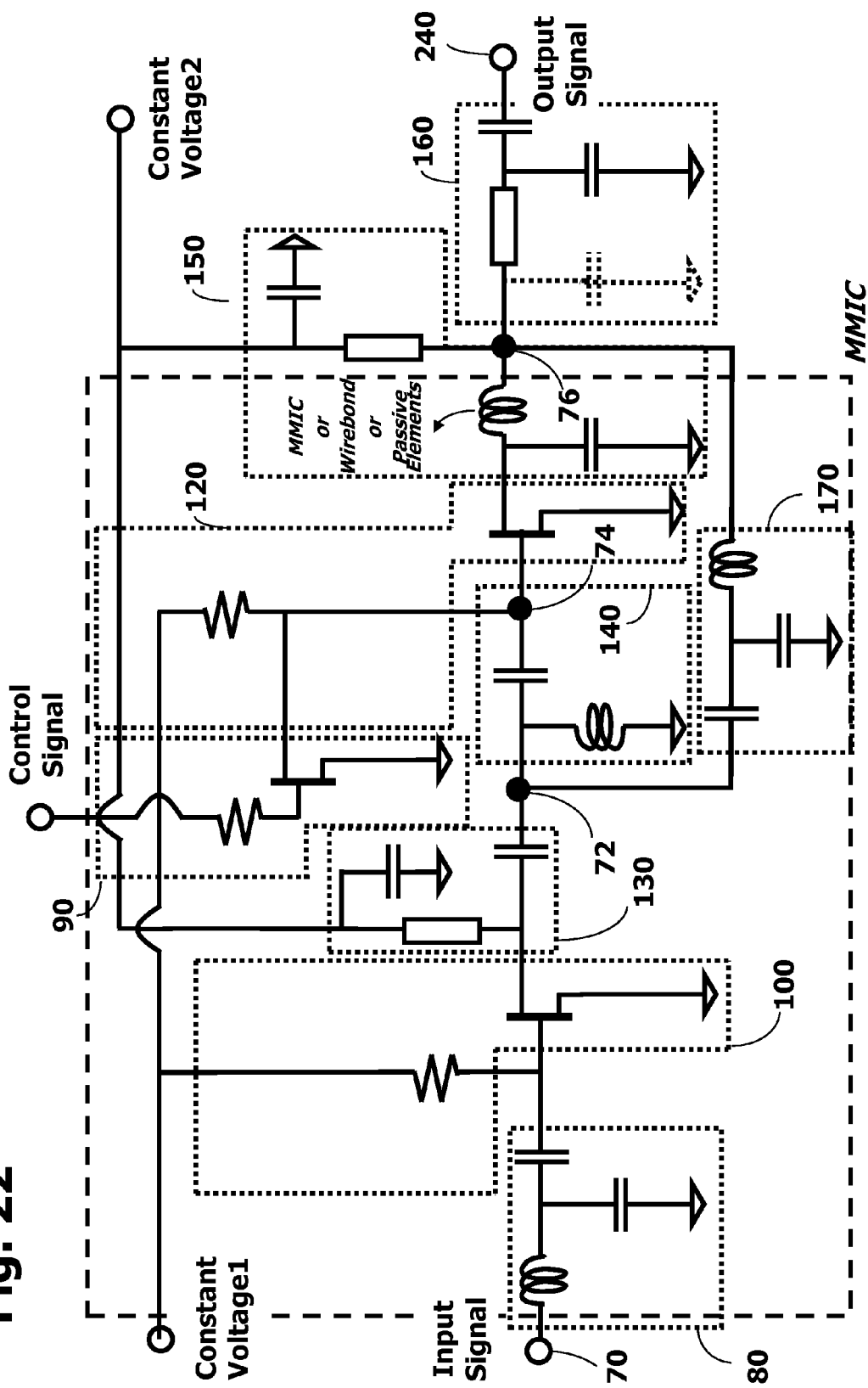
FIG. 22 shows a two-stage multiple mode amplifier circuit of the invention implemented using MESFET technology.

FIG. 22 shows a multiple mode amplifier circuit of the invention implemented using MESFET technology. This is a two-stage implementation such as shown in FIG. 5. This figure shows merely an example of an embodiment of the invention, and other embodiments are possible. For example, any of the alternative circuit configurations for the circuitry shown in FIGS. 15 to 17 and 19 may be substituted for the blocks in FIG. 22.

Figure 23:
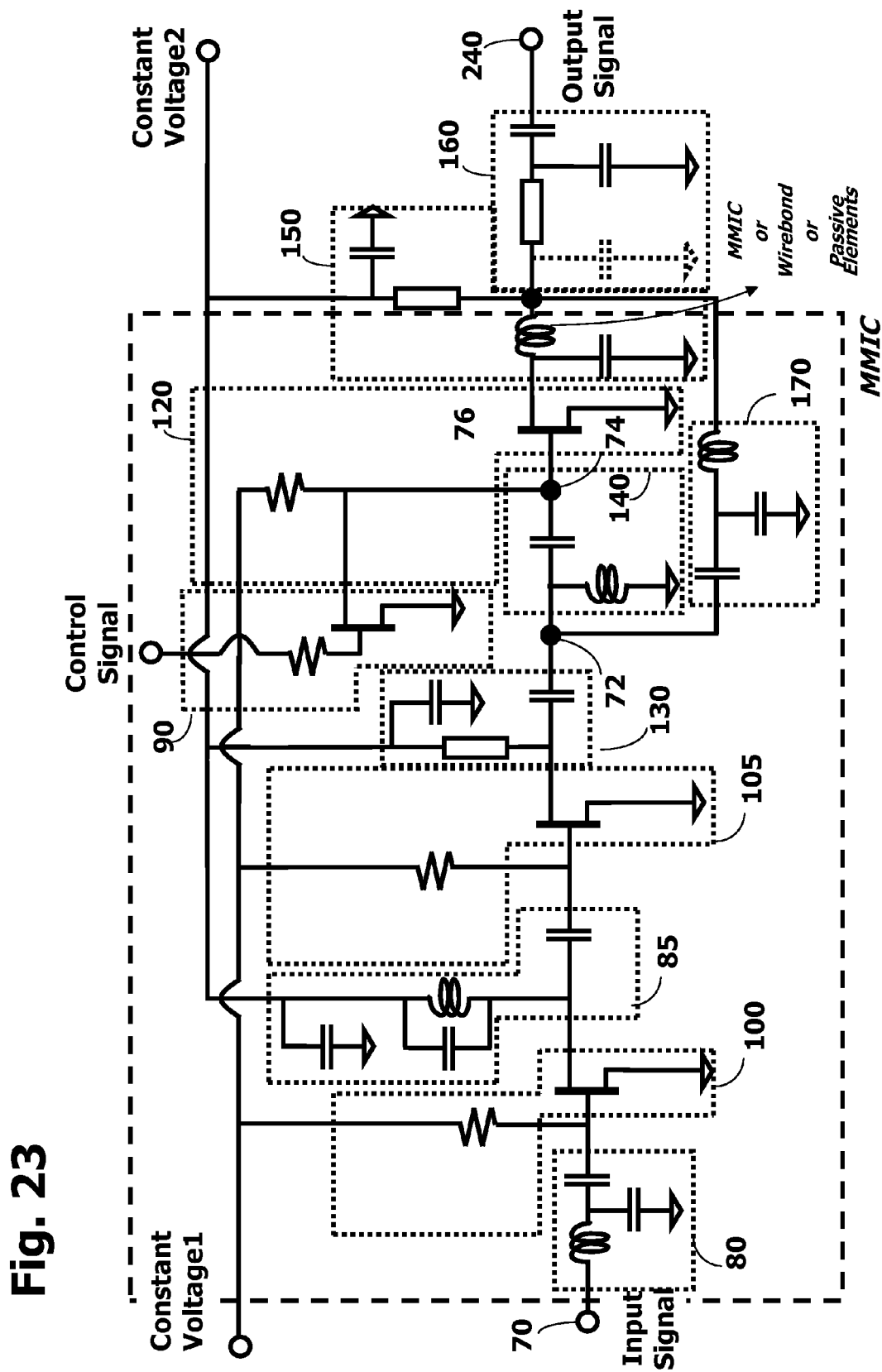
FIG. 23 shows a three-stage multiple mode amplifier circuit of the invention implemented using MESFET technology.

FIG. 23 shows a multiple mode amplifier circuit of the invention implemented using MESFET technology. This is a three-stage implementation such as shown in FIG. 12. This figure shows merely an example of an embodiment of the invention, and other embodiments are possible. For example, any of the alternative circuit configurations for the circuitry shown in FIGS. 15 to 17 and 19 may be substituted for the blocks in FIG. 23.

Figure 24:
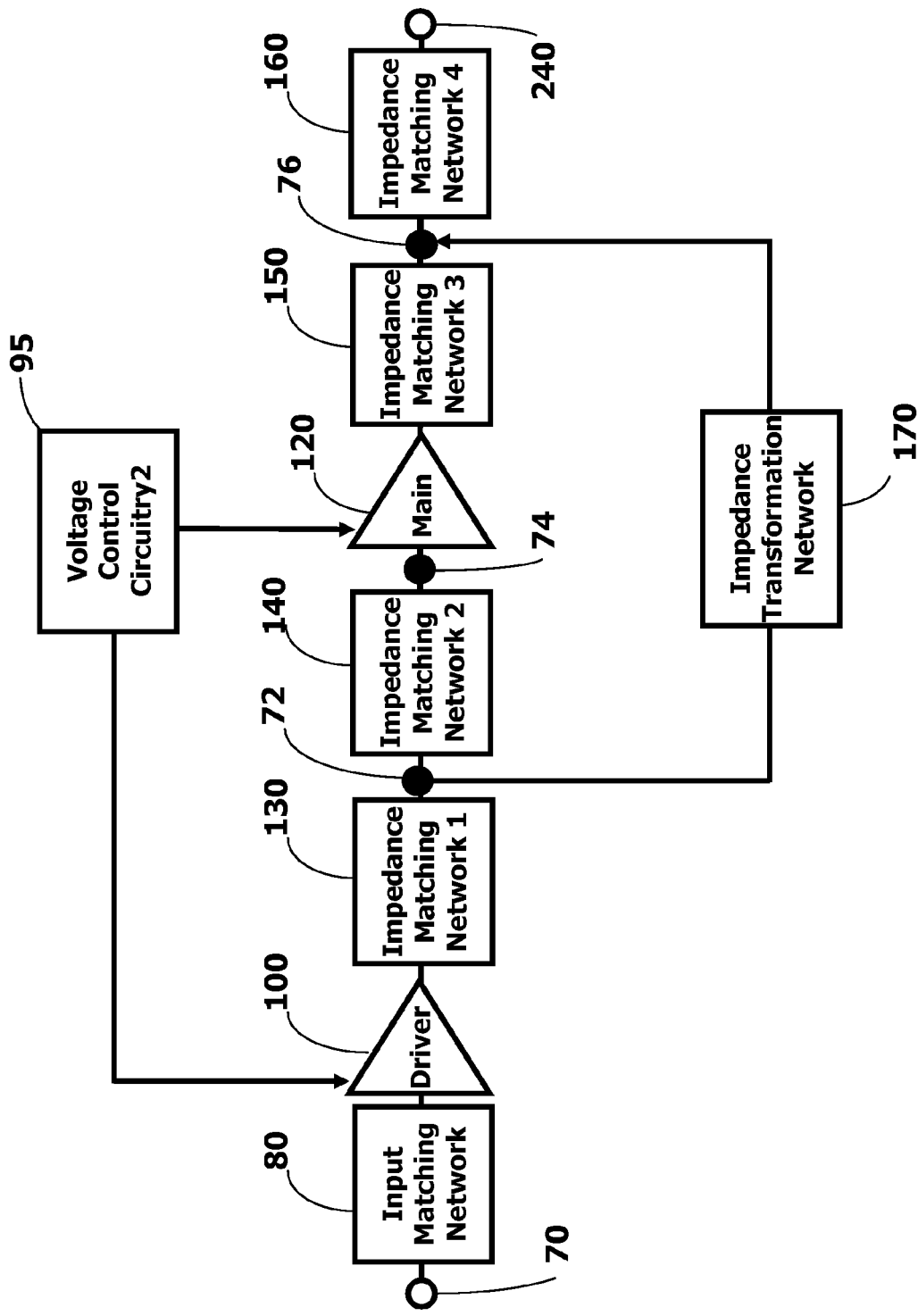
FIG. 24 shows an implementation of the amplifier circuit of FIG. 5 with bias modulation circuitry.

FIG. 24 shows an implementation of the amplifier circuit of FIG. 5 with bias modulation circuitry. FIG. 24 additionally shows a voltage control circuitry2 95 for a bias modulation circuit. The bias modulation circuit of this implementation is shown as a single block, but in other implementations, the circuitry may be divided among two or more blocks. A mode control voltage (not shown) is connected to voltage control circuitry2 95 to control operation of the circuitry. The voltage control circuitry2 95 is connected to driver 100 and power stage 120. In operation, the mode control voltage controls the operation of voltage control circuitry2 95. Depending on the mode control voltage, the voltage control circuitry2 95 will change biasing of driver 100 in order to alter it operating characteristics and place the power stage 120 in an on state or an off state.

In an embodiment, the mode control voltage and the voltage control circuitry2 95 is used to change the biasing of driver 100 to lower the power consumption of the driver 100 used to implement the amplifier. An amplifier has various modes of operations or design such as class A, class AB, class B, and other classes. Full class A operation of an amplifier refers to a very linear transfer curve, but high power consumption because the output transistors draw current all the time, until the amplifier starts to clip. Therefore, class A amplifier have low distortion but high power consumption, and consequently generate a lot of heat. A class B amplifier has zero standby current and starts consuming power when there is a signal. Although a class B amplifier has good power efficiency, this type of amplifier typically has significant distortion, especially when compared to a type A amplifier.

An amplifier may operate somewhere between class A and class B and will be known as a class AB amplifier. A class AB amplifier has current flow for more than half, but less than all, of the input cycle. In the invention, in the low power mode, the biasing of an amplifier, such as driver 100, may be changed so that the amplifier will save additional power, but at the same time, provide a good output characteristic. Depending on the number of amplifiers in the circuitry, this technique of the invention may used to provide varying degrees of power consumption and gain or amplification.

For example, for the circuitry in FIG. 24, in the high power mode, the power stage 120 is on and the driver 100 is on. In the low power mode, the power stage 120 is off and driver 100 is on. This is similar to the amplifier circuit in FIG. 5. However, in FIG. 24, the voltage control circuitry2 95 may additionally change (e.g., reduce) the biasing of driver 100 to lower its power consumption, compared to that in FIG. 5. In other words, although driver 100 is on in both high and low power modes, driver 100 will have lower power consumption in the low power mode than it will have when in the high power mode. This provides additional power savings. This aspect of the invention may be applied to any amplifier of the circuitry to provide additional power savings.

The bias modulation circuitry of the invention may be added to all the power amplifier module configurations described in this patent, two-, three-, four-, and N-stage implementations. FIG. 24 is provided as a simple example to explain the concepts of the invention, but similar circuitry and techniques may be applied to the other power amplifier module configurations. For example, bias modulation circuitry may be used in the power amplifier modules configuration in FIGS. 5, 8, 9, 10, 11, 12, 13, 14, 18, 20, 21, 22, and 23.

This voltage control circuitry2 95 for bias modulation takes the mode control signal, and when in the low power mode, it reduces the bias current to the first-stage transistor. A difference between the voltage control circuitry 90 and this voltage control circuitry2 95 for bias modulation is the fact that bias control modulation circuitry does not turn off the bias, but just reduces the bias supply in the low power mode. In this way, the bias supply to the first-stage transistor is reduced in the low power mode, maximizing the efficiency in the low power mode. The addition of this circuit allows further enhanced efficiencies in the low power mode.

Figure 25:
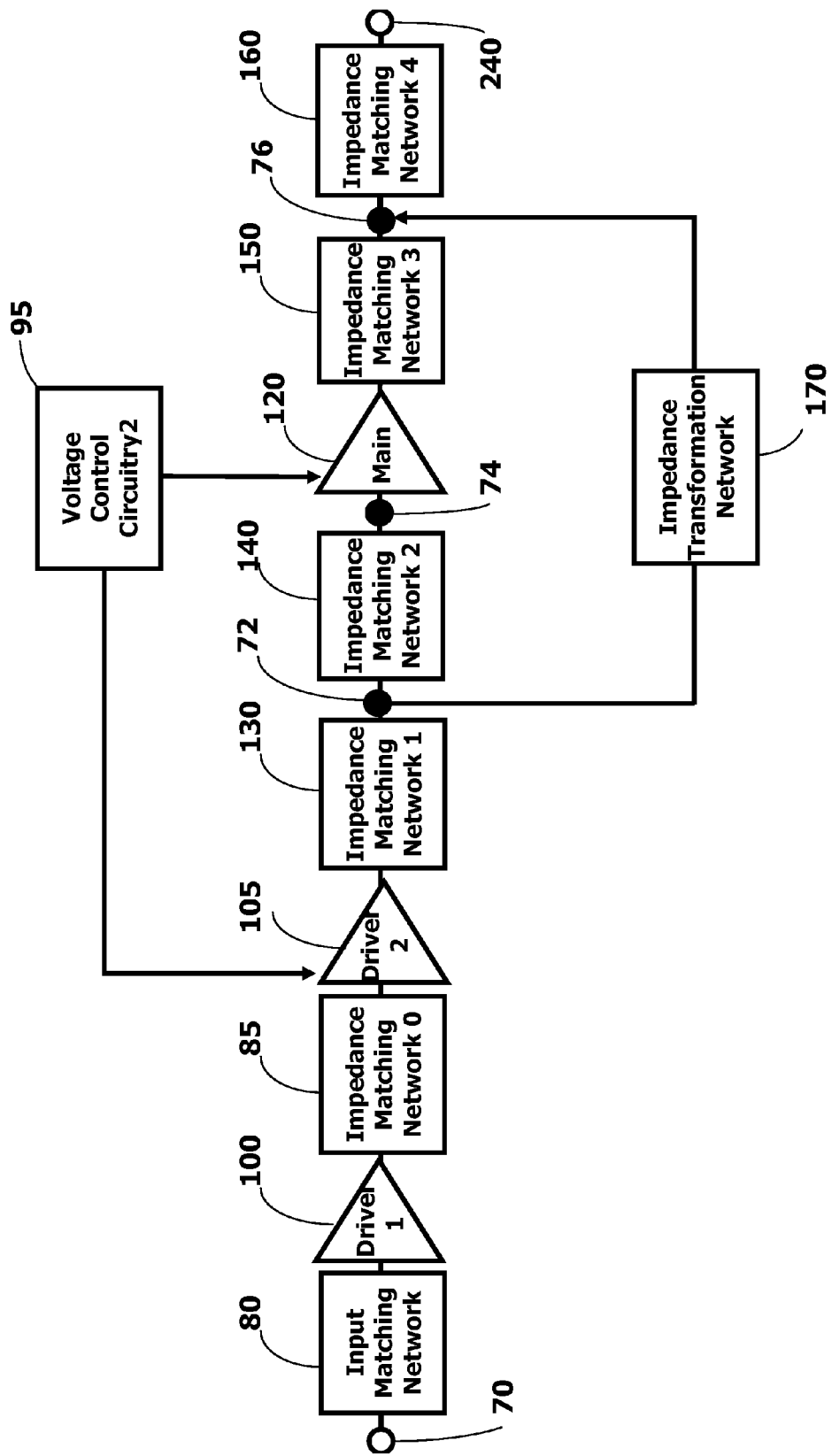
FIG. 25 shows an embodiment of the three-stage amplifier configuration of FIG. 12 with amplifier bias modulation.

FIG. 25 shows an embodiment of the three-stage amplifier configuration of FIG. 12 with amplifier bias modulation. In FIG. 12, the switchless switching power amplifier turns off one or more of the stages when in the low power mode. For example, in the three-stage implementation of FIG. 12, voltage control circuitry 90 turns off the last stage (power stage 120) when in the lower power mode. In the FIG. 25 configuration, additional bias modulation circuitry is included in driver 2 105 so that reduced bias supply current (quiescent current) to driver 2 can be applied in the low-power mode. In other words, in the lower power mode, the main transistor is turned off, and additionally, driver 2 transistor is biased at the reduced bias current level (such as class AB, but closer to class B). In this way, there is will be a further improvement in the low-power mode efficiency.

Figure 26B:
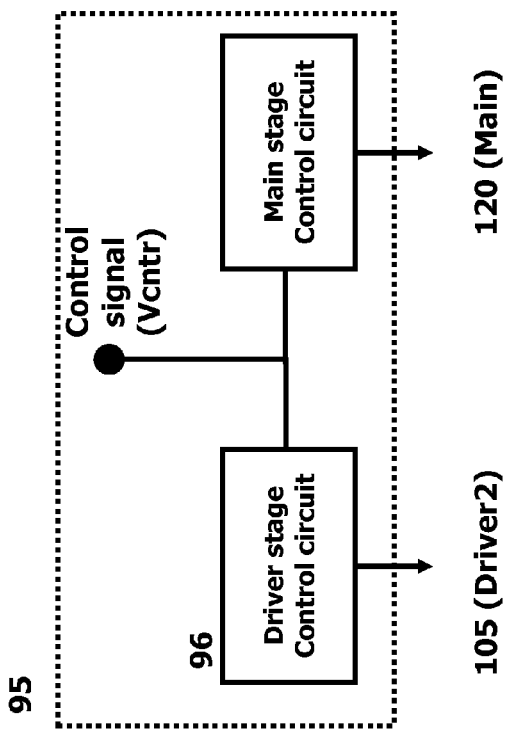
FIGS. 26A and 26B further illustrate the reduced bias supply concept of the invention.
Figure 26A:
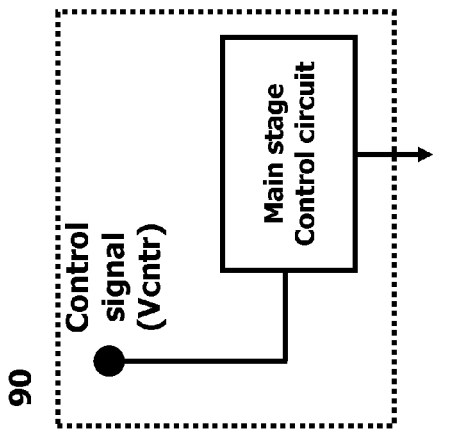

FIGS. 26A and 26B further illustrate the reduced bias supply concept of the invention. In FIG. 26A, the control signal (Vcntr) effectively turns on or off the main stage control circuit, reducing the overall power consumption when the main stage is off. In the scheme of FIG. 26B, the mode control signal (Vcntr) turns off the main stage transistor using a main stage bias control circuit 90. At the same time, it also reduces the bias current to the driver transistor using a driver stage control circuit 96. As noted above, the circuitry in block 95 may be divided into multiple blocks. For example, the main stage control circuit may be in a different block from driver stage control circuit 96.

FIG. 27 shows a more detailed circuit diagram of a specific implementation of a bias modulation circuit scheme of FIG. 26B. FIG. 27 shows the details of control circuitry in box 95. Box 95 has circuitry 90 as in FIG. 26A. Further, in box 95 is the bias modulation circuitry discussed above, which reduces the bias voltage to the driver 2 transistor, reducing its power consumption in the low power mode further. There are two voltage levels, Vref and VCC, also labeled as constant voltage1 and constant voltage2, respectively. In operation, depending the mode control voltage (Vcntr), the main transistor driver will be on or off, and the driver2 transistor will be specific mode of operation, say a high bias or low bias mode, where the high bias mode provide more amplification at the cost of higher power than in the low bias mode. In operation, when increasing a voltage Vcntr, a bias voltage at the driver2 will decrease. When decreasing a voltage Vcntr, a bias voltage at the driver2 will increase. Therefore, the bias voltage at driver2 has a negative relationship with respect to Vcntr. However, in other implementations, the relationship between Vcntr and driver2 may be positive, where an increase at Vcntr increases the bias voltage, and a decrease at Vcntr decreases the bias voltage. Furthermore, the circuitry in FIG. 27 shows a common Vcntr signal used for both the box 90 and box 96 circuitry. In other implementations, these may be separate signals.

Figure 28:
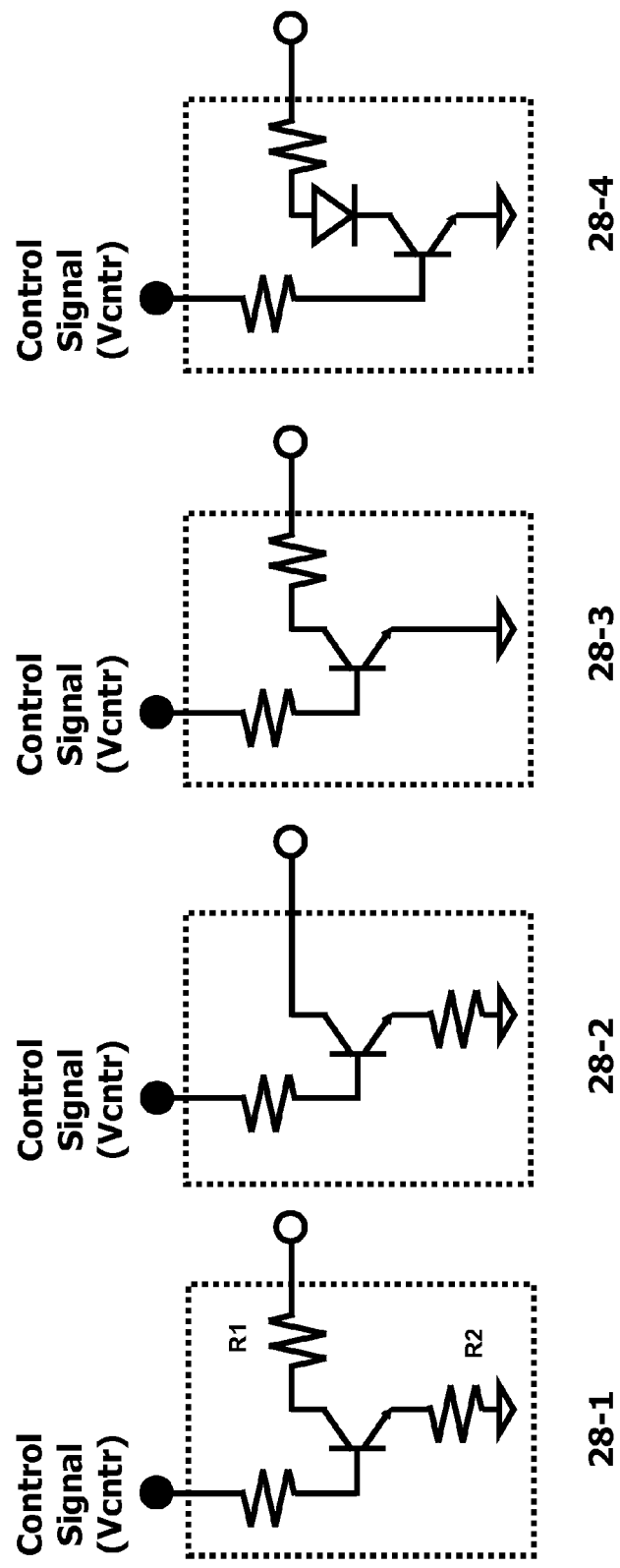
FIG. 28 shows four examples of the driver stage control circuitry.

FIG. 28 shows four examples of the driver stage control circuitry. Configuration 28-1 has two resistors or impedances (besides an impedance connected to Vcntr) for fine tuning the driver2 bias. However, only one resistor or impedance (besides an impedance connected to Vcntr) may be needed such as configuration 28-2 and 28-3. Another alternative is to use a combination of a resistor or impedance and one or more level shifting diodes such as in configuration 28-4. Generally, a greater number of diodes means there is a greater voltage or potential difference. Any of these configurations may be substituted for circuitry 96 in FIG. 27.

Figure 29B:
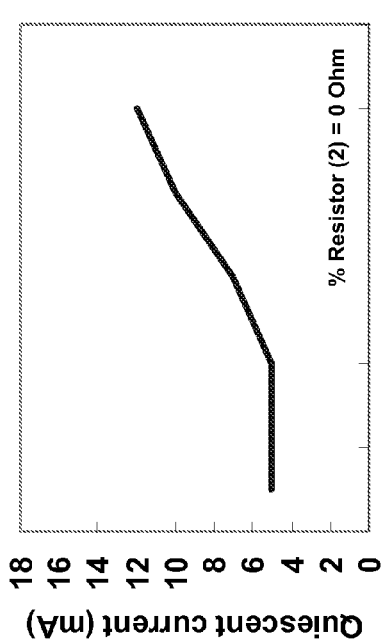
FIGS. 29B and 29C show graphs of how R1 or R2 can be used to fine tune the bias supply current to the driver2 transistor at the design stage.
Figure 29C:
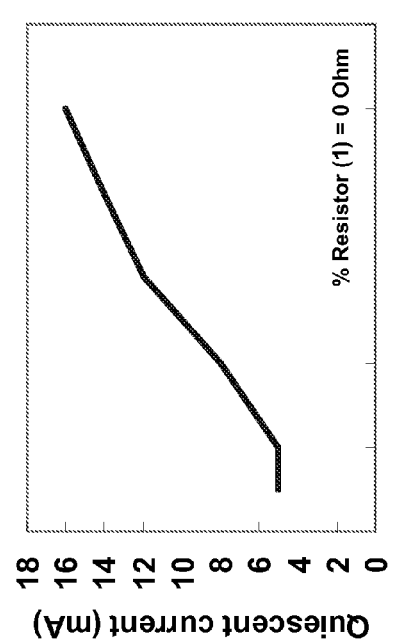
Figure 29A:
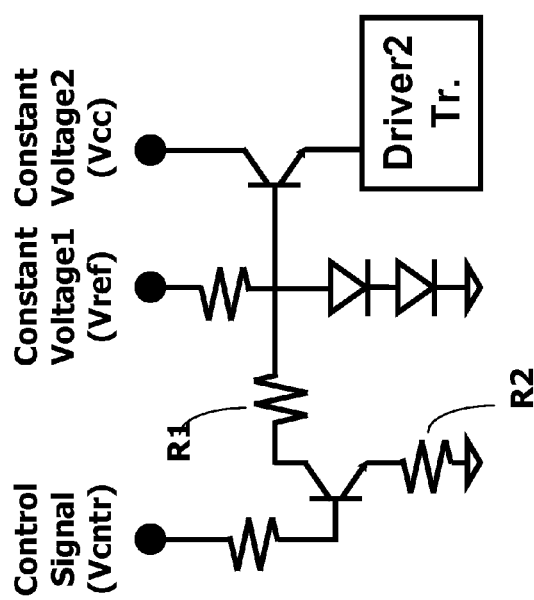
FIG. 29A shows a voltage control circuit connected to an amplifier driver for altering its bias voltage.

FIG. 29A shows a voltage control circuit connected to an amplifier driver for altering its bias voltage. FIGS. 29B and 29C show graphs of how R1 or R2 can be used to fine tune the bias supply current to driver2 transistor at the design stage. By using smaller R1 and R2 resistors during the design, the quiescent current of the driver2 stage transistor is reduced. The extreme case of this curves will be when R1 and R2 are 0, in which case, the driver2 stage is almost turned off as in the case of main-stage transistor in the low power mode (see the bias control circuit 90 of the main-stage transistor).

Figure 30:
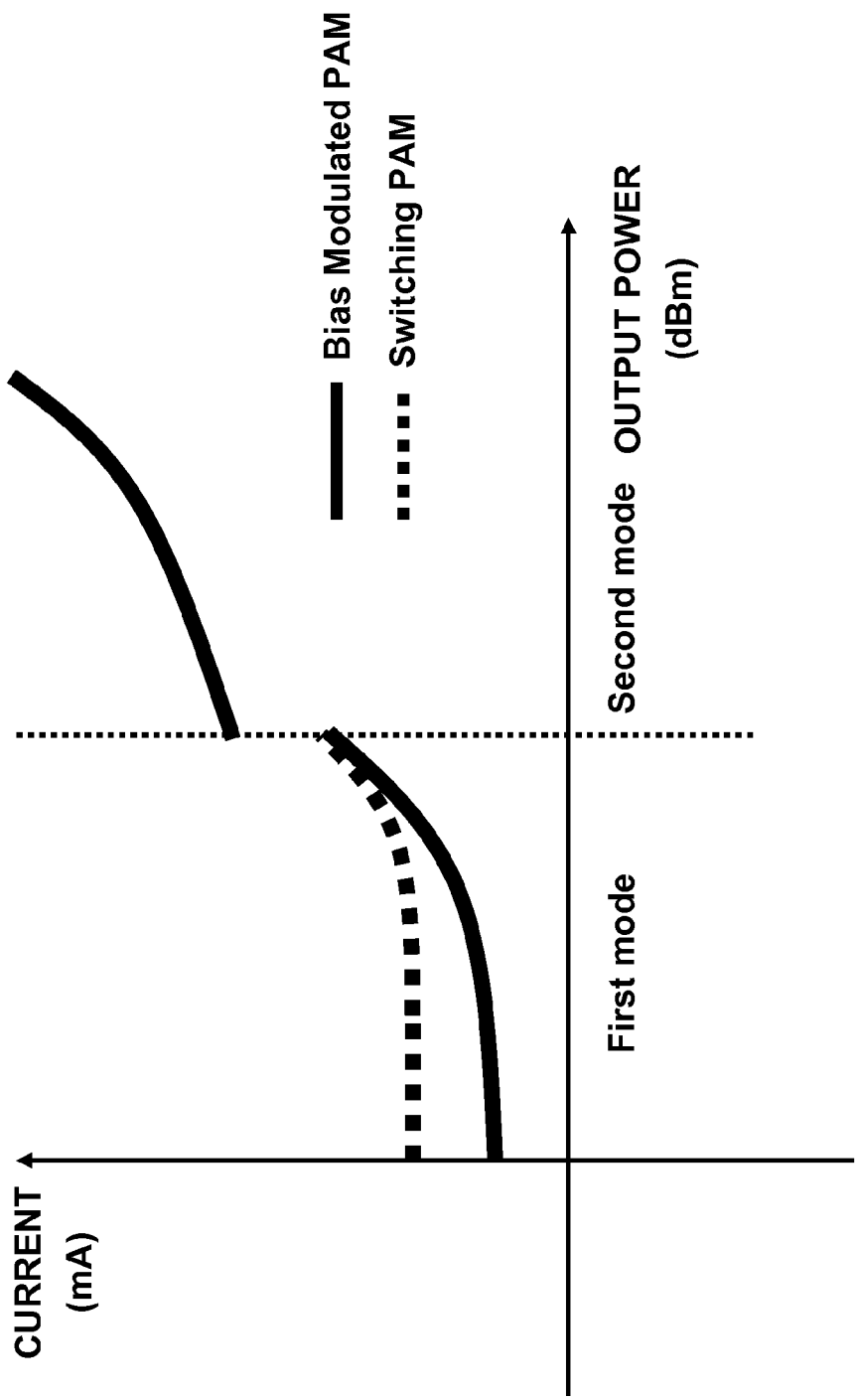
FIG. 30 shows a graph of the current variation versus the output power.

FIG. 30 shows a graph of the current variation versus the output power. The bias modulation concept allows further reduction in the overall bias current in the low power mode by reducing the driver2 bias current as well. It is worthwhile to note that the current reduction is more predominant in the real low-power region, which is advantageous in a specific application of improving the talk time a CDMA-based handset. In the graph, the solid line is for the power amplifier module (PAM) with bias modulation to reduce power consumption. The dotted line is for the power amplifier module with only switching (i.e., to turn the main amplifier off).

Figure 31:
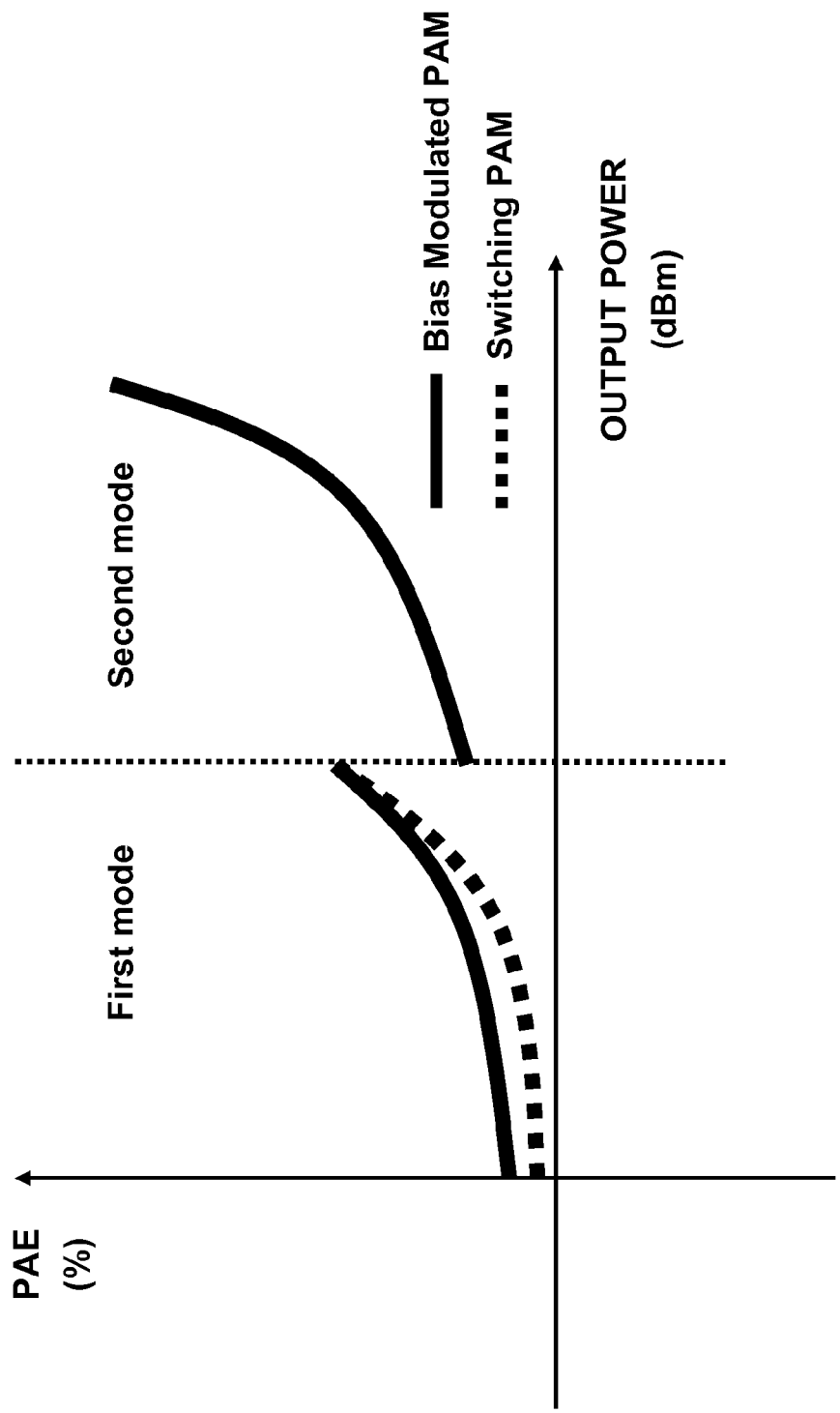
FIG. 31 shows a graph of the efficiency (PAE) versus the output power.

FIG. 31 shows a graph of the efficiency (PAE) versus the output power. Reduced current consumption translates into further improved efficiencies in the low power mode. In the graph, the solid line is for the power amplifier module with bias modulation to reduce power consumption. The dotted line is for the power amplifier module with only switching (i.e., to turn the main amplifier off).

Figure 32:
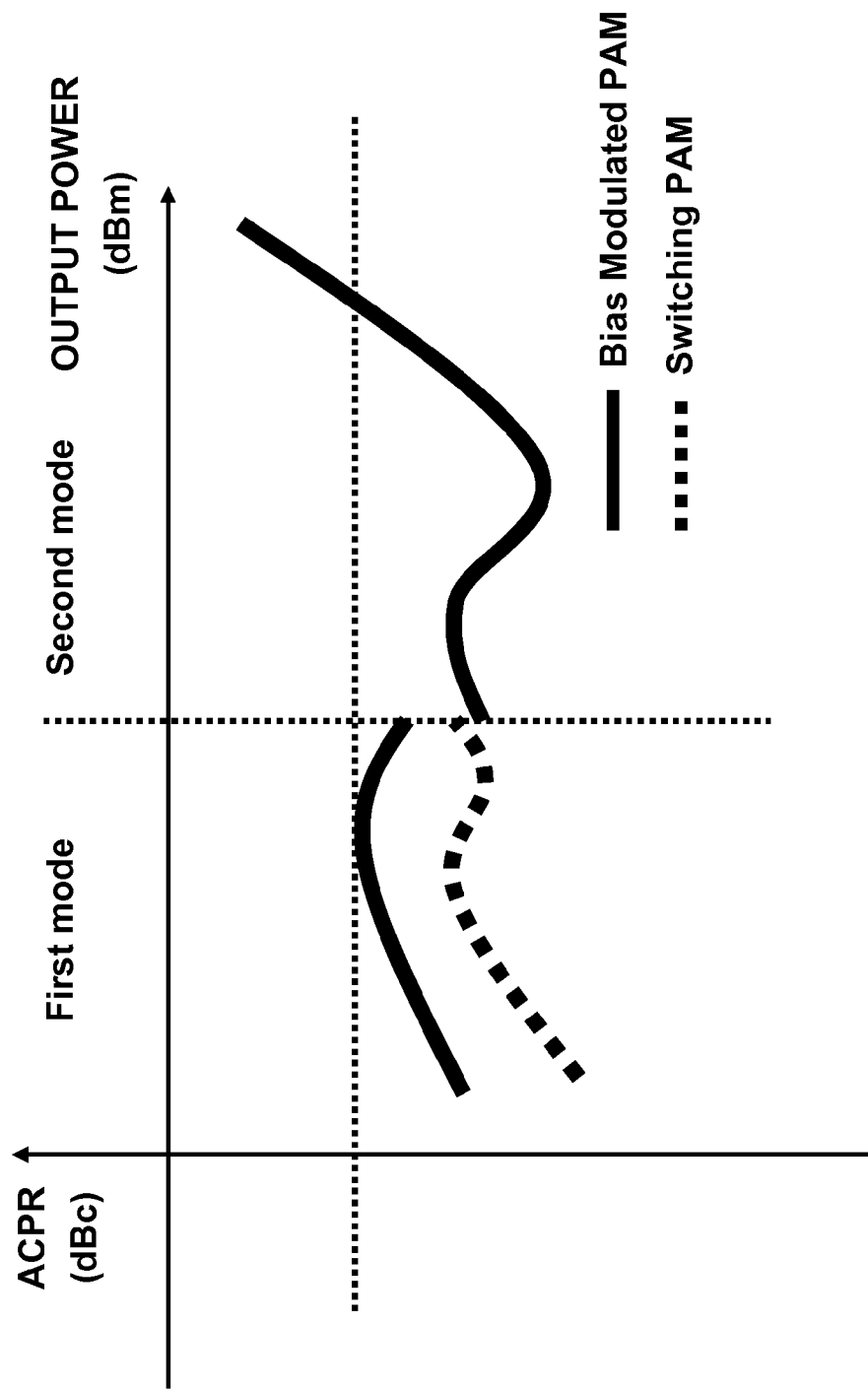
FIG. 32 shows a graph of the ACPR versus the output power.

FIG. 32 shows a graph of the ACPR versus the output power. By further reducing the bias current in the low power mode, compromised linearity is naturally expected. However, these results are still within the allowable limit. In other words, in this concept, we try to minimize the overall current consumption by compromising the linearity more while still staying within the limit of system (e.g., a CDMA system).

Figure 33:
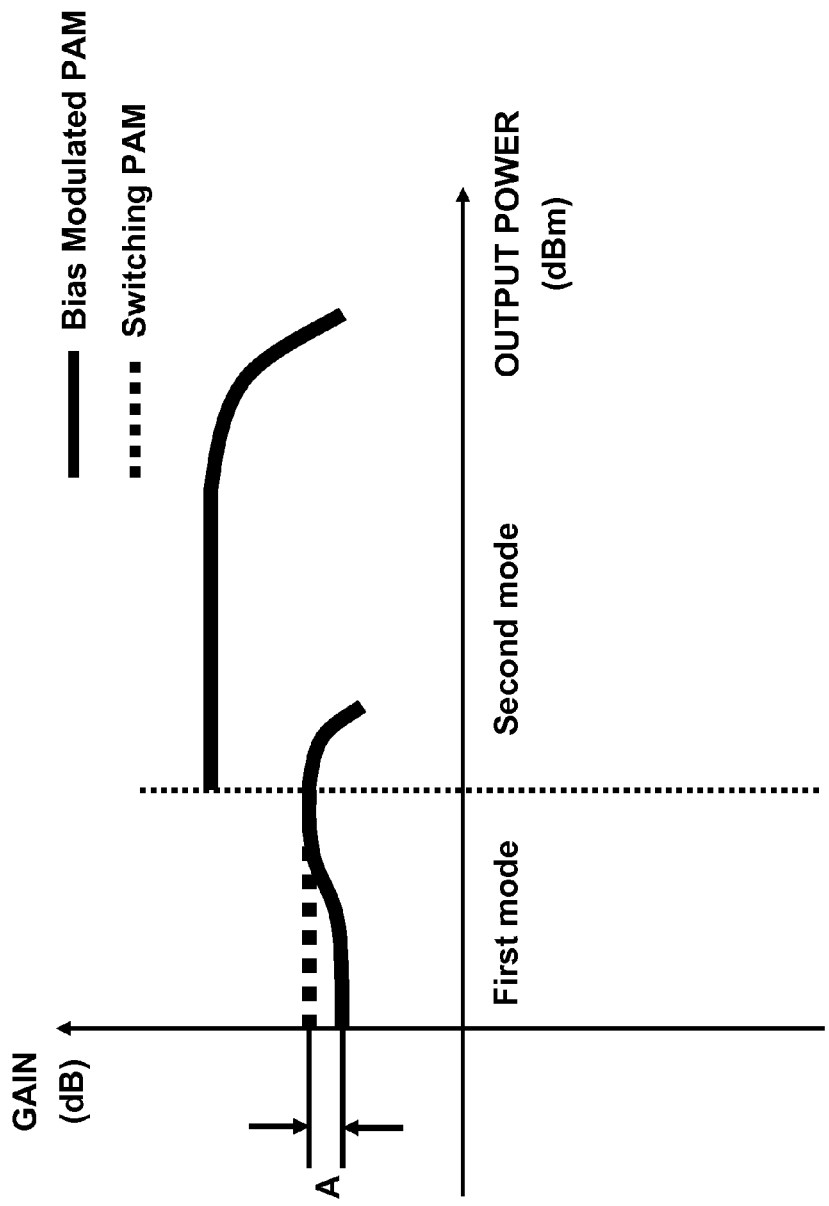
FIG. 33 shows a graph of the gain versus the output power.

FIG. 33 shows a graph of the gain versus the output power. By further reducing the bias current in the low power mode, the bias to the driver 2 stage is almost close to class-B case rather than class-AB. It is natural and customary to see the gain expansion as the output power is increased in the class-B amplifiers. This graph clearly shows such a gain variation in the low power mode. The gain step can be about 2 dB when the overall quiescent current is reduced to 10 milliamps. The basic power amplifier configuration of the invention (without bias modulations) gives an overall quiescent current of 22 milliamps.

The embodiments of the present invention have been described above for purposes of illustrating the present invention. It is not intended to be exhaustive or to limit the invention to the precise form described. Many modifications and variations are possible in light of the teaching above. Accordingly, the scope of the invention is defined by the appended claims.

What is claimed is:

1. An integrated circuit comprising:
    a first transistor coupled between an input node and a first node;
    a first impedance matching circuit coupled between the first node and a second node;
    a second impedance matching circuit coupled between the second node and a third node;
    a second transistor coupled between the third node and a fourth node;
    a third impedance matching circuit coupled between the fourth node and a fifth node; and
    an impedance transforming circuit coupled between the second node and the fifth node,
    wherein in a first mode of operation, a signal provided at the input node passes through the first transistor, first impedance matching circuit, and impedance transforming circuit,
    in a second mode of operation, the signal provided at the input node passes through the first transistor, first impedance matching circuit, second impedance matching circuit, second transistor, and third impedance matching circuit; and
    a voltage control circuit coupled to the first transistor, wherein the voltage control circuit, in response to the mode control voltage, provides a signal to the first transistor to adjust a bias of the first transistor so during the first mode of operation the bias of the first transistor is reduced compared to the bias of the first transistor during the second mode of operation.

2. The integrated circuit of claim 1 wherein the voltage control circuit comprises a third transistor coupled to the first transistor through a resistance and coupled to a reference voltage level through a resistance, wherein an electrode of the third transistor is coupled to a voltage control line.

3. The integrated circuit of claim 1 wherein the voltage control circuit comprises a third transistor coupled to the first transistor and coupled to a reference voltage level through a resistance, wherein an electrode of the third transistor is coupled to a voltage control line.

4. The integrated circuit of claim 1 wherein the voltage control circuit comprises a third transistor coupled to the first transistor through a resistance and coupled to a reference voltage level, wherein an electrode of the third transistor is coupled to a voltage control line.

5. The integrated circuit of claim 1 wherein the voltage control circuit comprises:
   a third transistor;
   a resistance; and
   one or more level shifting diodes, connected in series with the resistance,
   wherein the resistance and the one or more level shifting diodes are coupled in series to the first transistor,
   the third transistor is coupled to the resistance and the one or more level shifting diodes and coupled to a reference voltage level, and
   an electrode of the third transistor is coupled to a voltage control line.

* * * * *